(12) United States Patent
Jiang et al.

(10) Patent No.: US 12,205,901 B2
(45) Date of Patent: Jan. 21, 2025

(54) PLASMA-DAMAGE-RESISTANT INTERCONNECT STRUCTURE AND METHODS FOR FORMING THE SAME

(71) Applicant: Taiwan Semiconductor Manufacturing Company Limited, Hsinchu (TW)

(72) Inventors: Jheng-Hong Jiang, Hsinchu (TW); Chia-Wei Liu, Zhubei (TW); Shing-Huang Wu, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 27 days.

(21) Appl. No.: 18/342,335

(22) Filed: Jun. 27, 2023

(65) Prior Publication Data

US 2023/0343711 A1     Oct. 26, 2023

Related U.S. Application Data

(62) Division of application No. 17/218,435, filed on Mar. 31, 2021, now Pat. No. 11,728,272.

(51) Int. Cl.
    *H01L 23/535*        (2006.01)
    *H01L 21/321*        (2006.01)
    (Continued)

(52) U.S. Cl.
    CPC ........ *H01L 23/535* (2013.01); *H01L 21/3212* (2013.01); *H01L 21/76805* (2013.01);
    (Continued)

(58) Field of Classification Search
    CPC .............. H01L 23/535; H01L 21/3212; H01L 21/76805; H01L 21/76816; H01L 21/7684;
    (Continued)

(56) References Cited

U.S. PATENT DOCUMENTS

| 10,157,774 B1 | 12/2018 | Peters et al. |
| 2006/0180930 A1 | 8/2006 | Nguyen et al. |

(Continued)

FOREIGN PATENT DOCUMENTS

| CN | 108461477 A | 8/2018 |
| CN | 105264660 B | 1/2019 |
| TW | 201735130 A | 10/2017 |

OTHER PUBLICATIONS

TW Patent and Trademark Office; TW Application No. 110121998; Office Action mailed Jun. 18, 2024; 14 pages.

*Primary Examiner* — Britt D Hanley
*Assistant Examiner* — Vicki B. Booker
(74) *Attorney, Agent, or Firm* — The Marbury Law Group, PLLC

(57) ABSTRACT

A device structure may include an interconnect-level dielectric material layer located over a substrate, a first metal interconnect structure embedded in the interconnect-level dielectric material layer and including a first metallic barrier liner and a first metallic fill material portion, and an overlying dielectric material layer. An opening in the overlying dielectric material layer may be formed entirely within an area of the first metallic barrier layer and outside the area of the first metallic fill material portion to reduce plasma damage. A second metal interconnect structure contacting a top surface of the first metallic barrier liner may be formed in the opening. An entirety of a top surface the first metallic fill material portion contacts a bottom surface of the overlying dielectric material layer.

20 Claims, 16 Drawing Sheets

(51) Int. Cl.
    *H01L 21/768*     (2006.01)
    *H01L 23/528*     (2006.01)
    *H01L 23/532*     (2006.01)

(52) U.S. Cl.
    CPC .... *H01L 21/76816* (2013.01); *H01L 21/7684* (2013.01); *H01L 21/76843* (2013.01); *H01L 21/76895* (2013.01); *H01L 23/5283* (2013.01); *H01L 23/53266* (2013.01)

(58) Field of Classification Search
    CPC ......... H01L 21/76843; H01L 21/76895; H01L 23/5283; H01L 23/53266; H01L 24/03; H01L 24/05; H01L 2224/04042; H01L 2224/05027; H01L 2224/05559; H01L 23/5226; H01L 23/53223; H01L 23/528; H01L 21/76841; H01L 2221/1073
    See application file for complete search history.

(56) References Cited

U.S. PATENT DOCUMENTS

| | | | |
|---|---|---|---|
| 2010/0078819 A1* | 4/2010 | Shin | H01L 23/53238 |
| | | | 438/653 |
| 2012/0119366 A1 | 5/2012 | Li et al. | |
| 2013/0043556 A1 | 2/2013 | Horak et al. | |
| 2018/0033690 A1 | 2/2018 | Yang | |

* cited by examiner

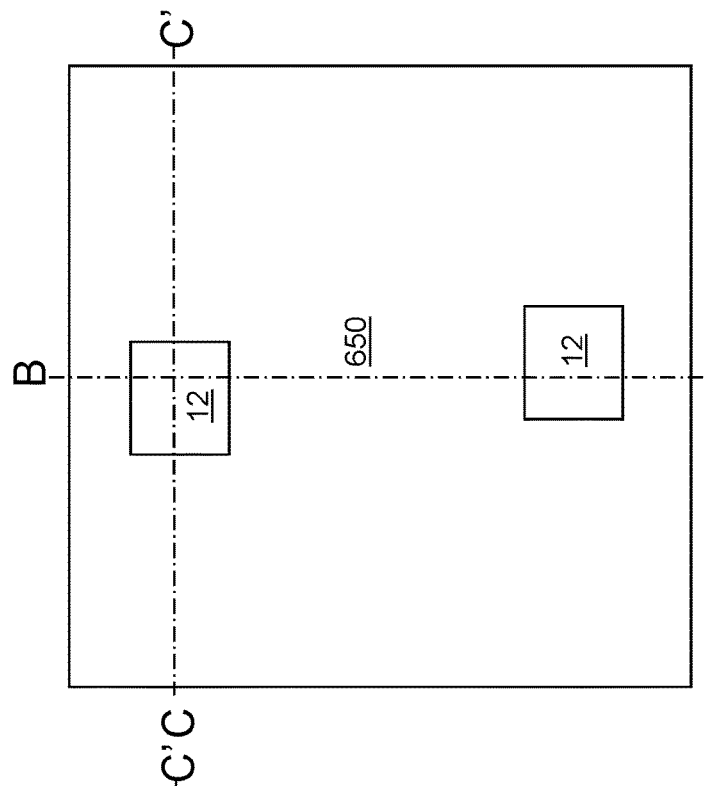
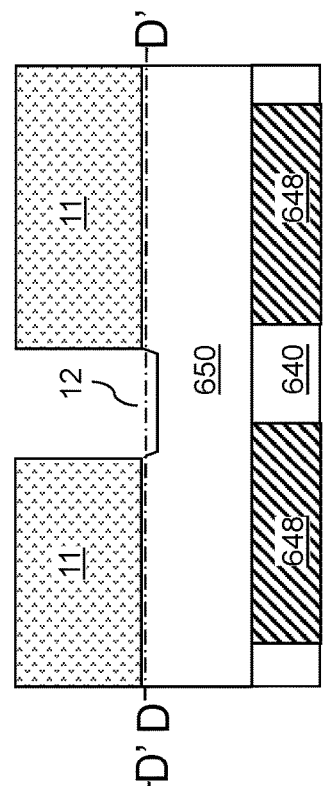
FIG. 2A / FIG. 2B
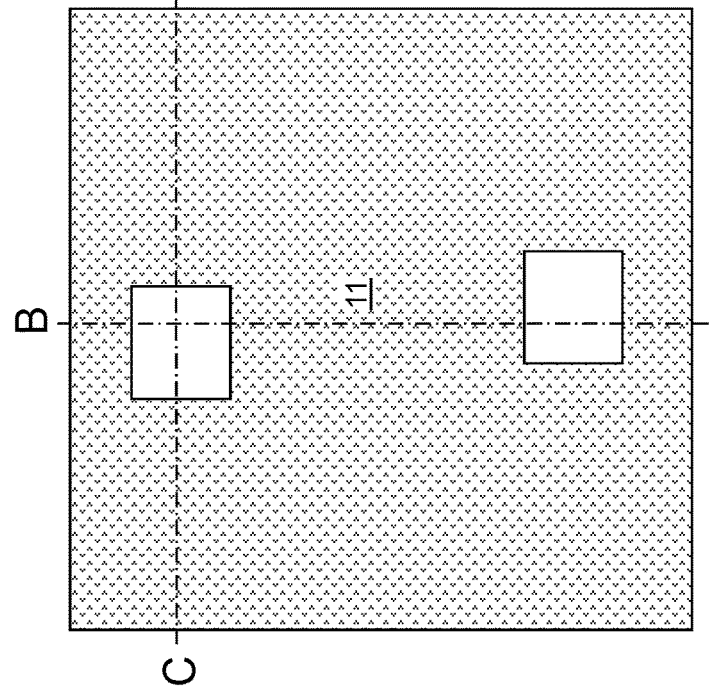
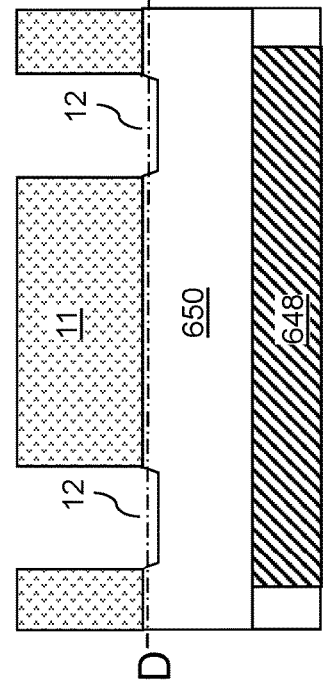
FIG. 2C / FIG. 2D

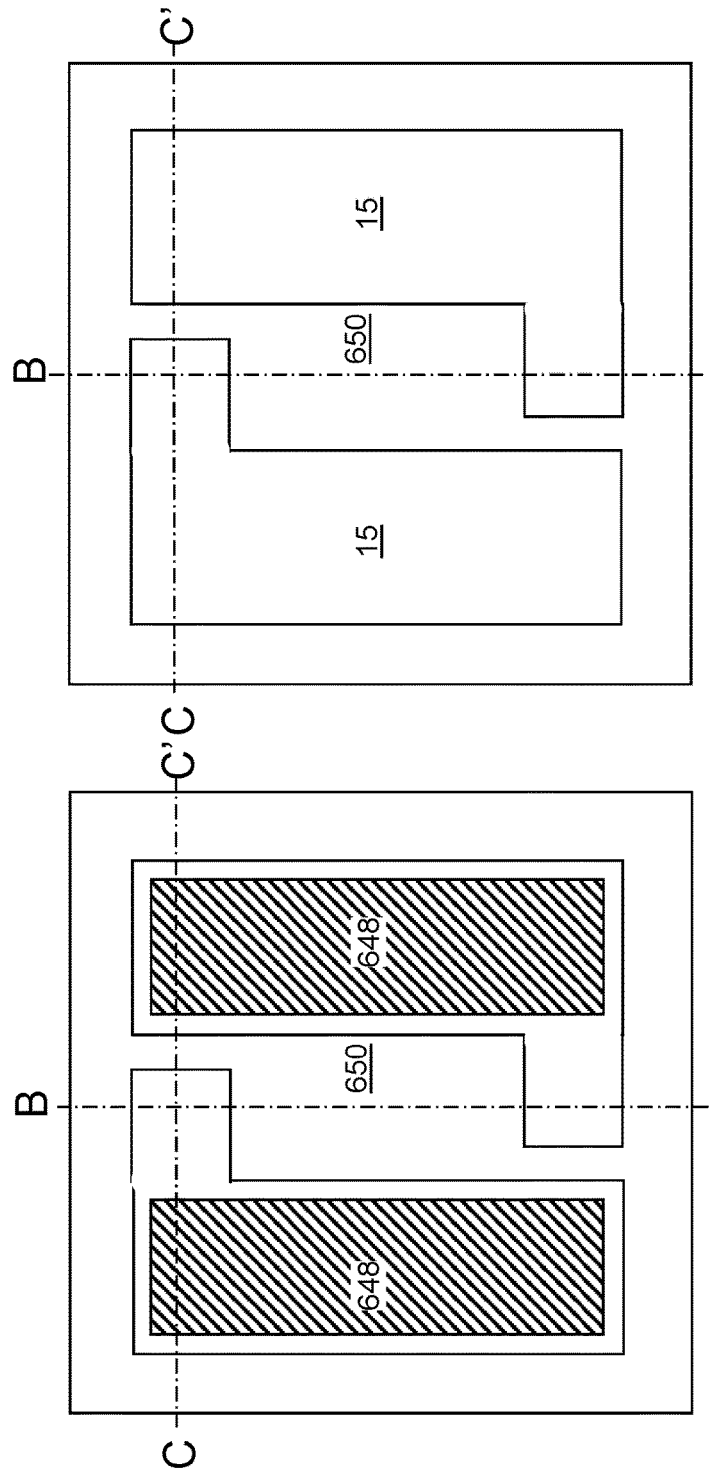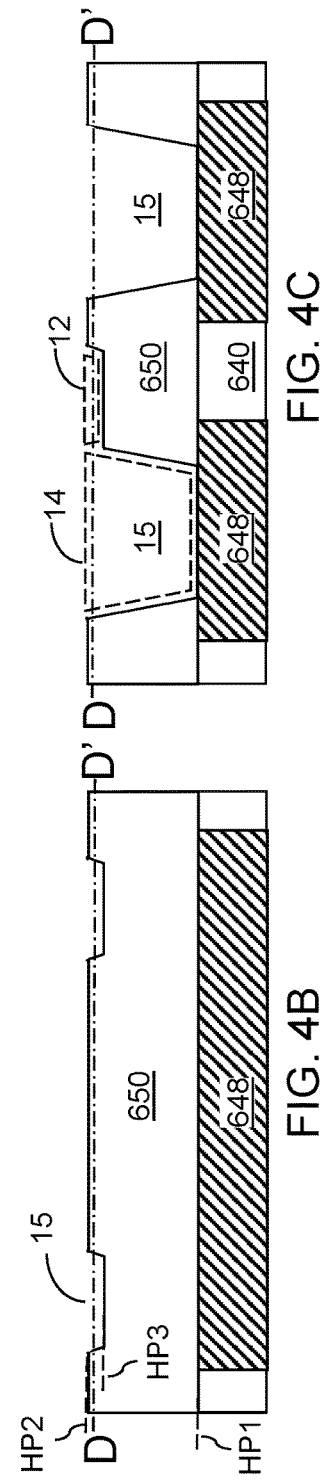

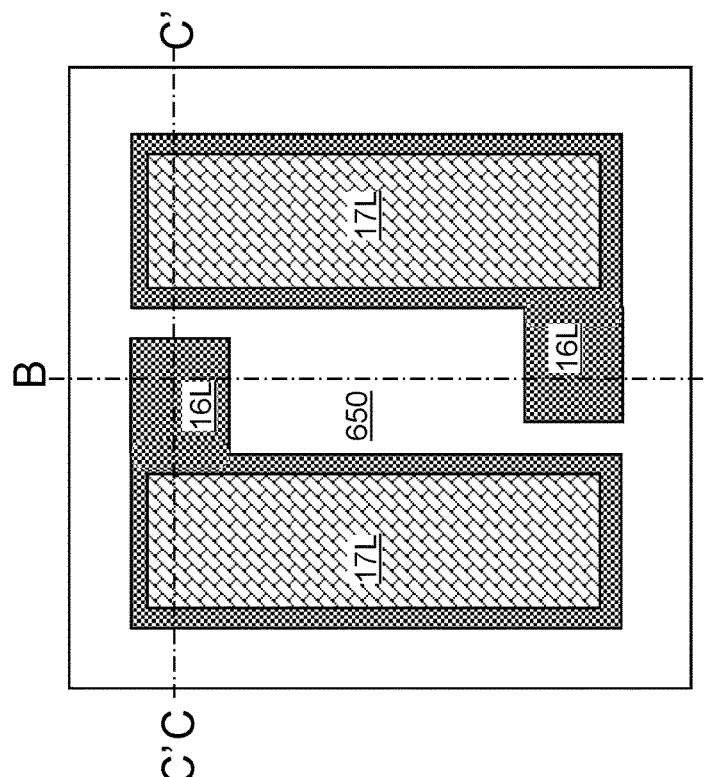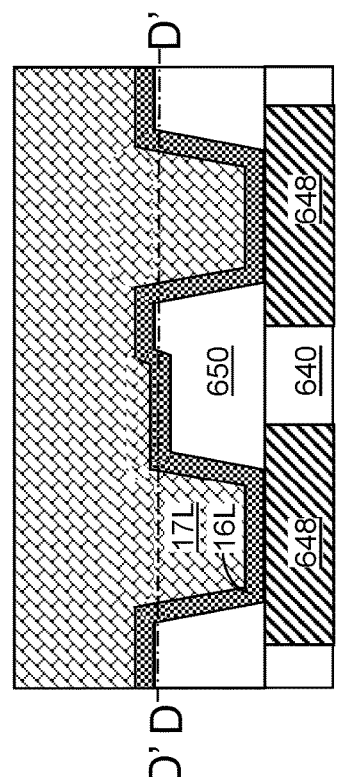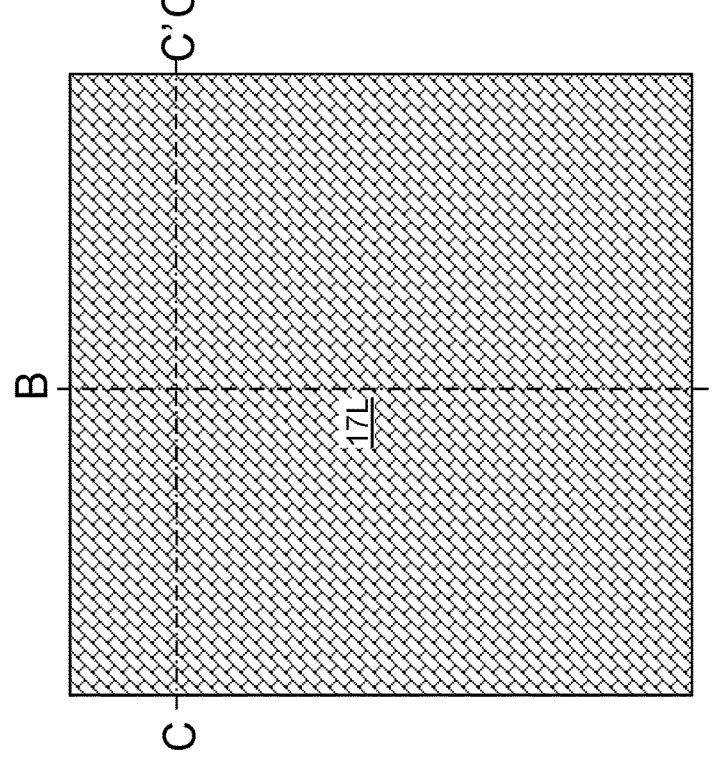

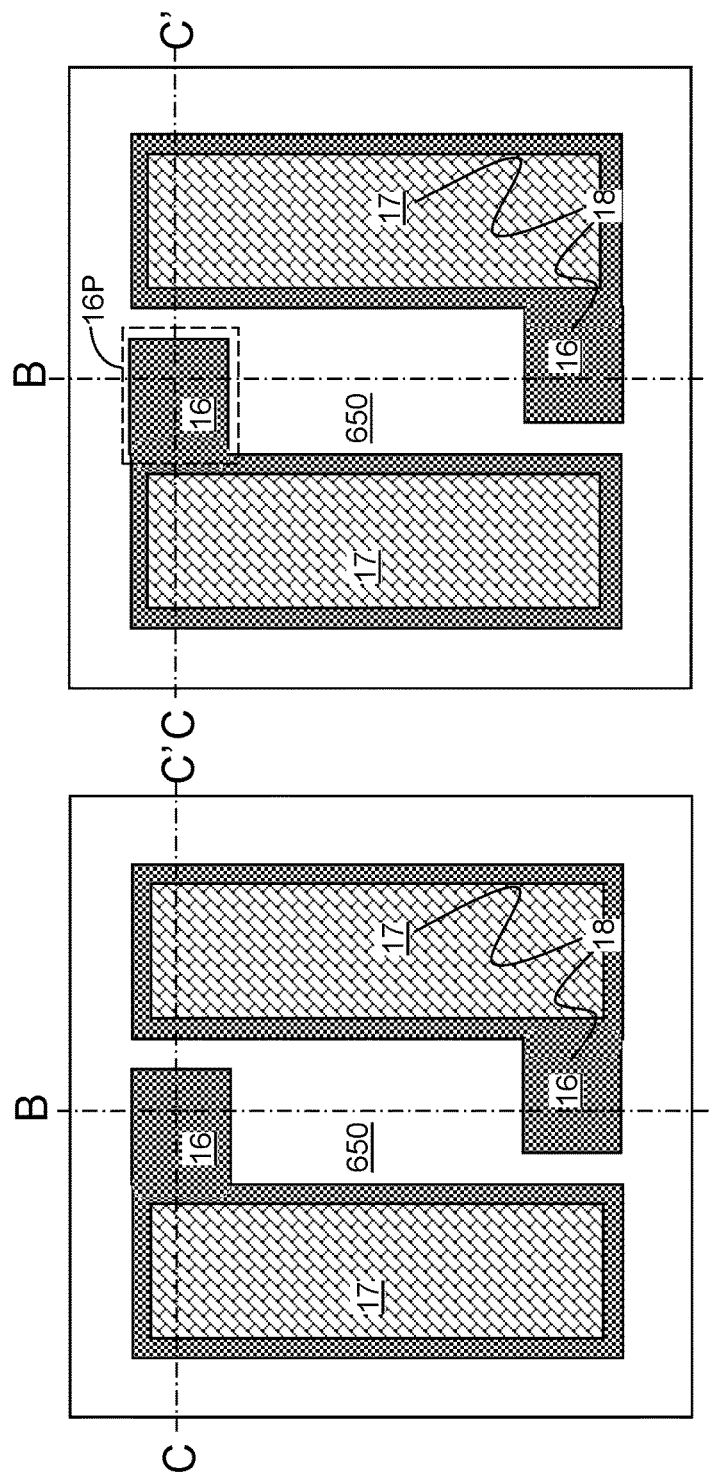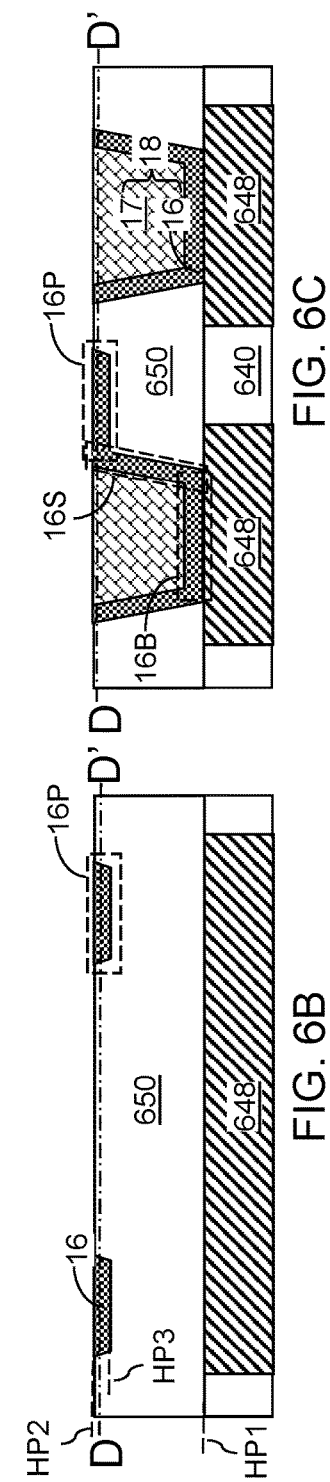

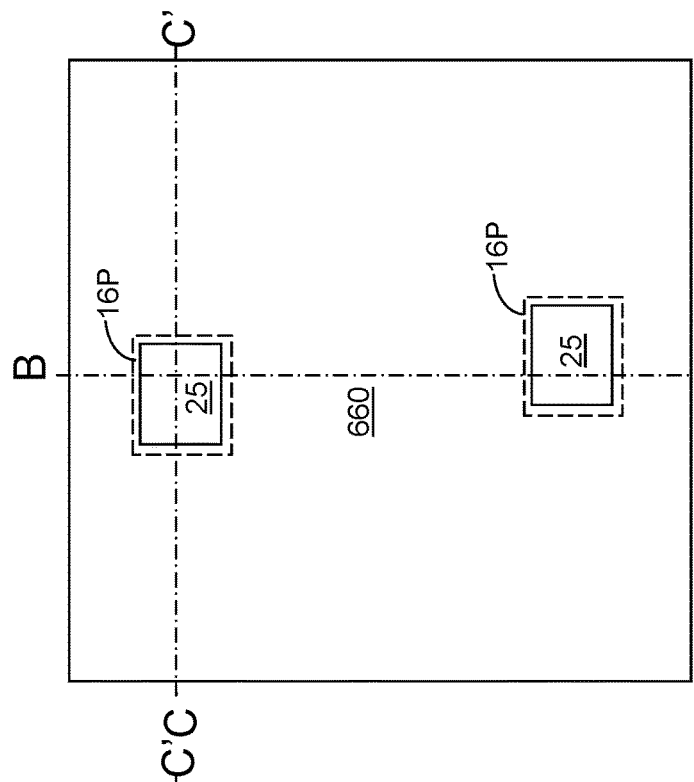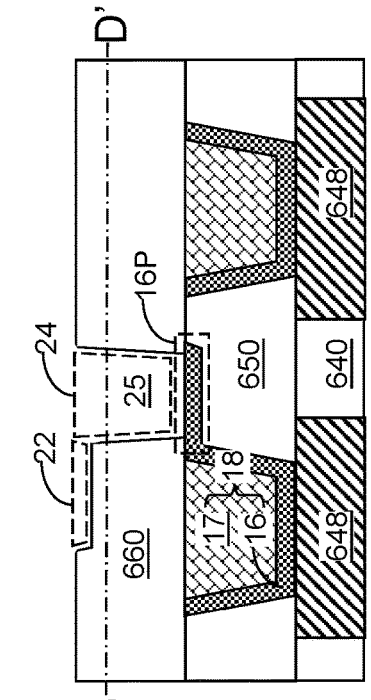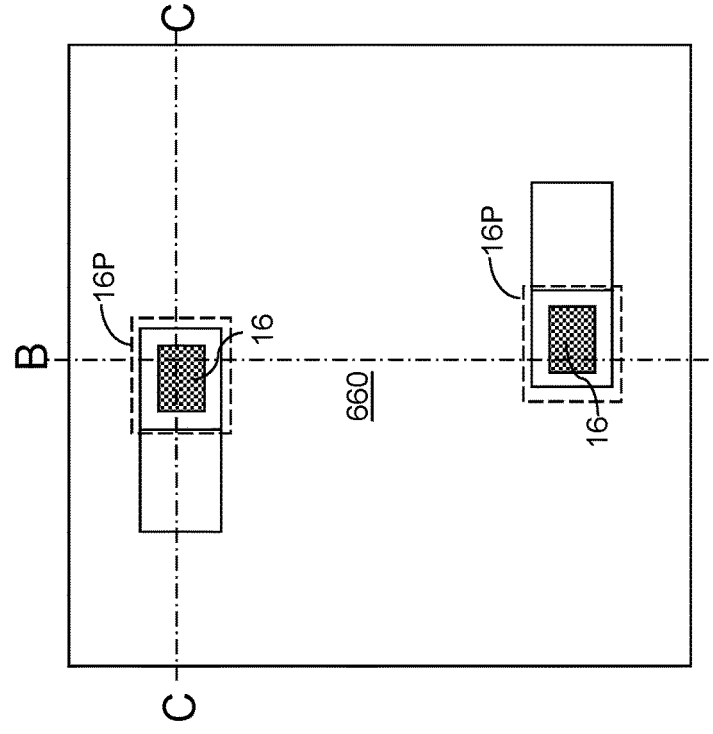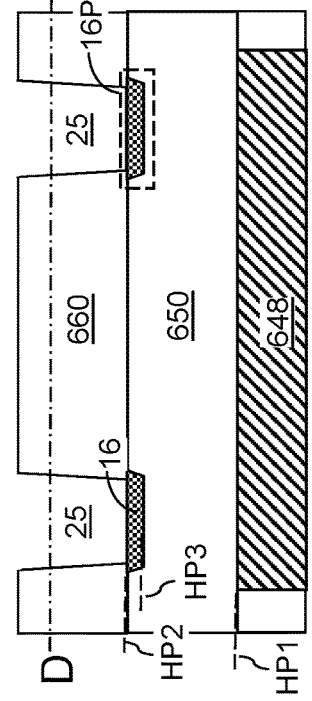

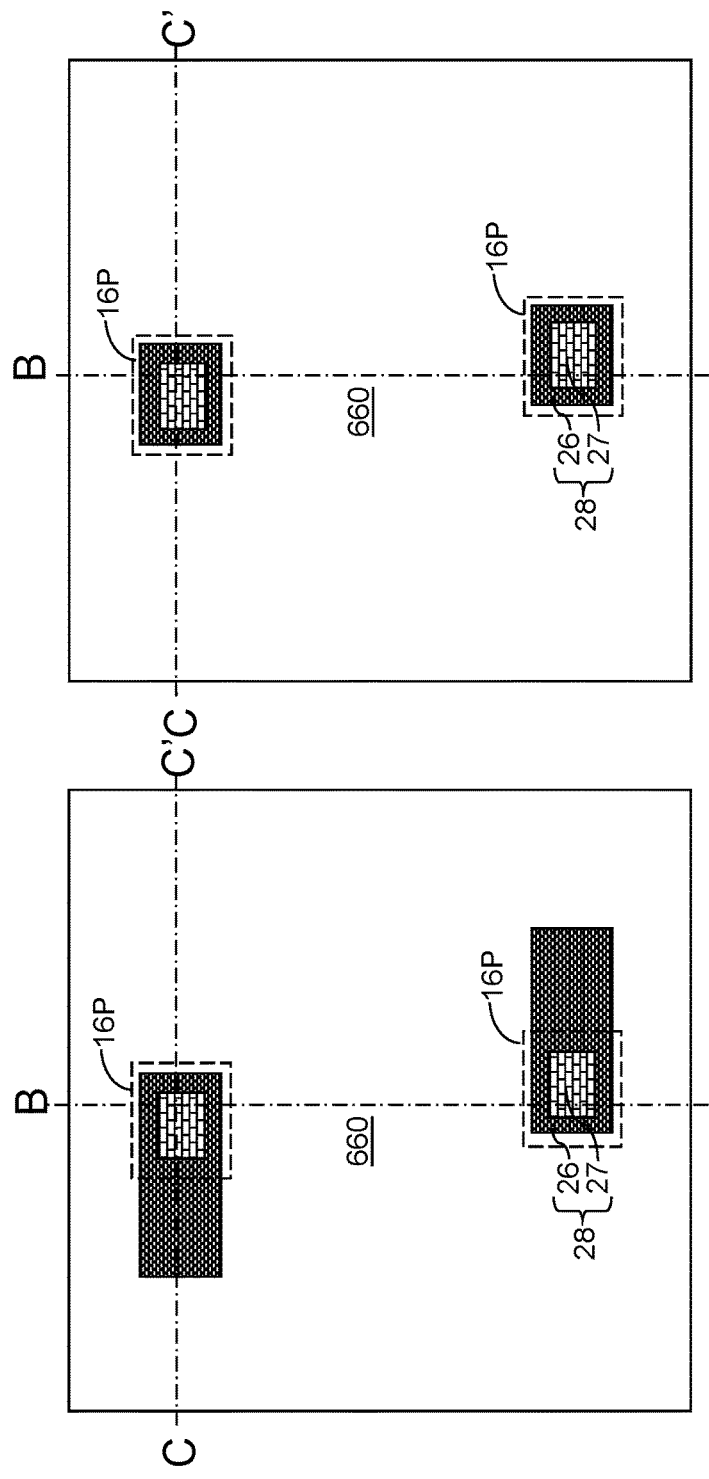

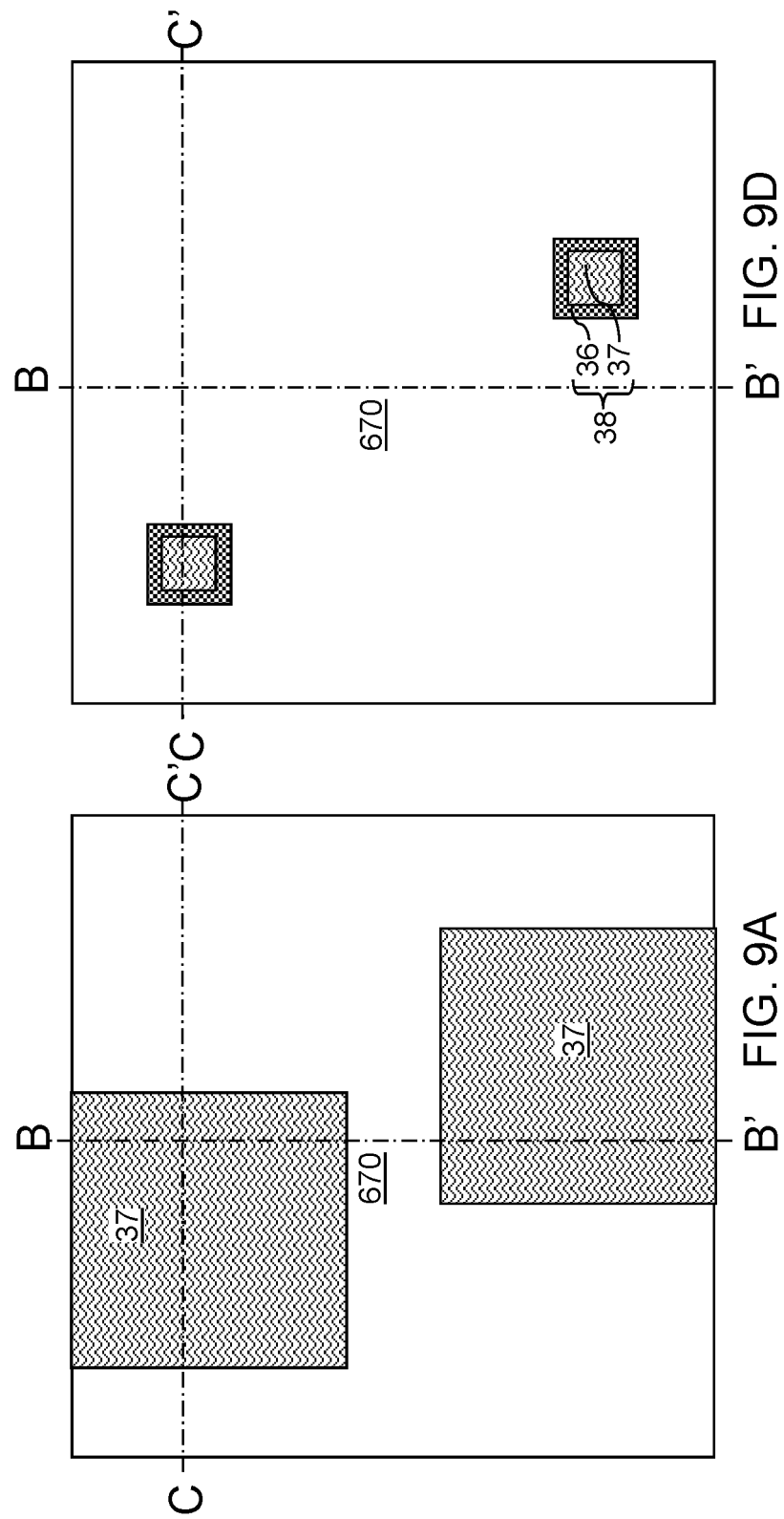

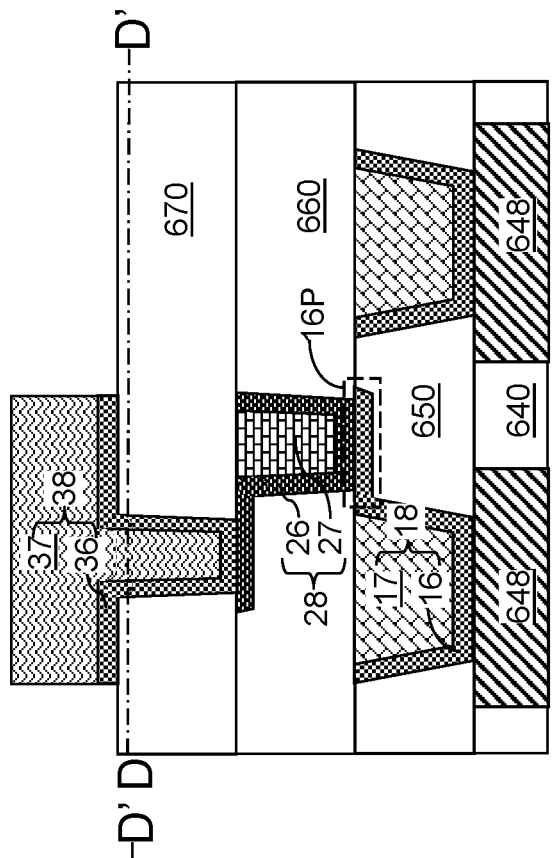
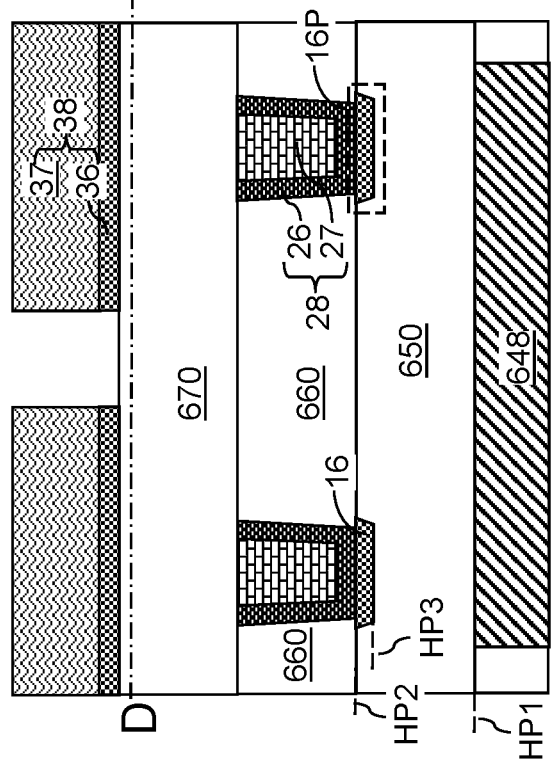
FIG. 9C
FIG. 9B

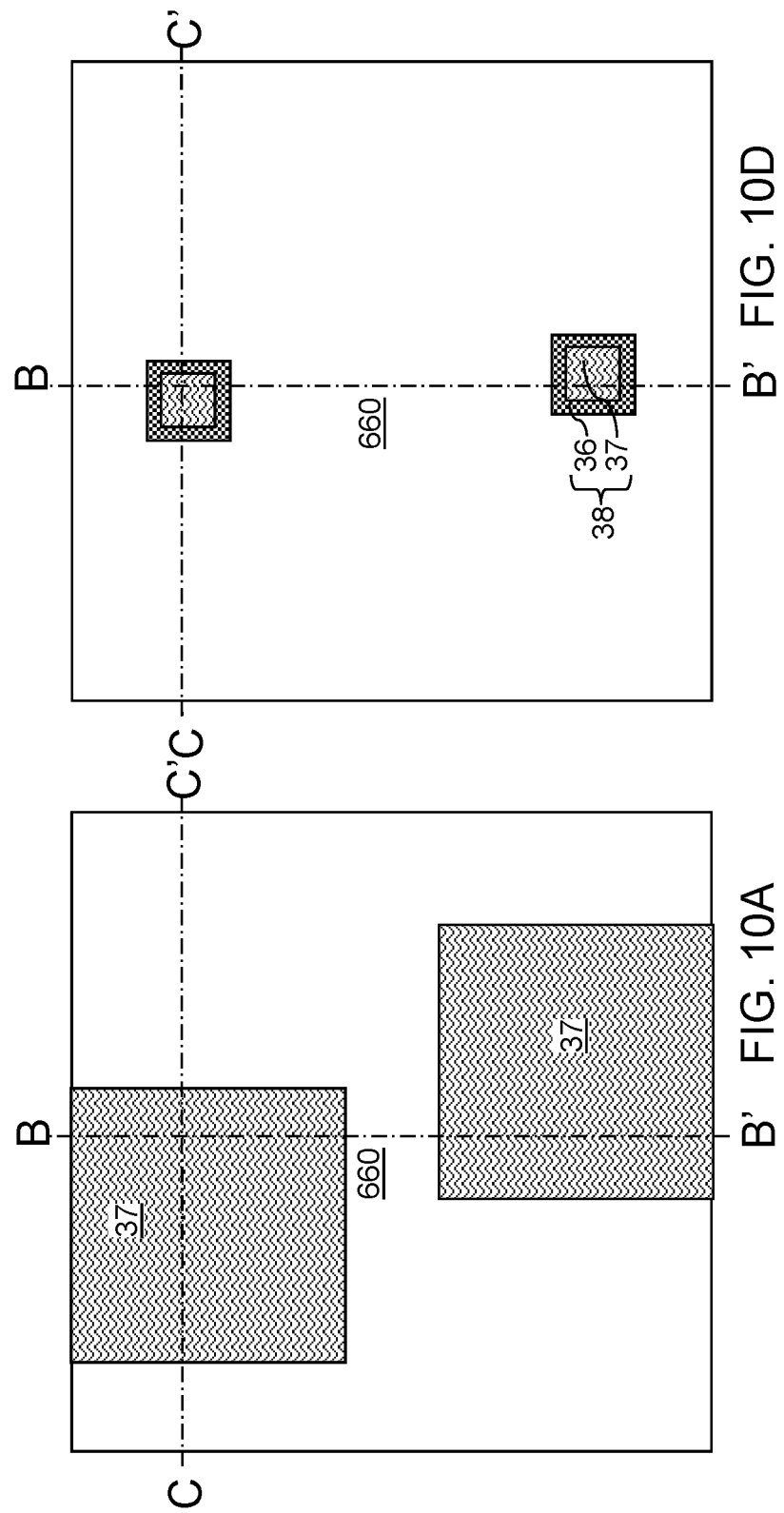

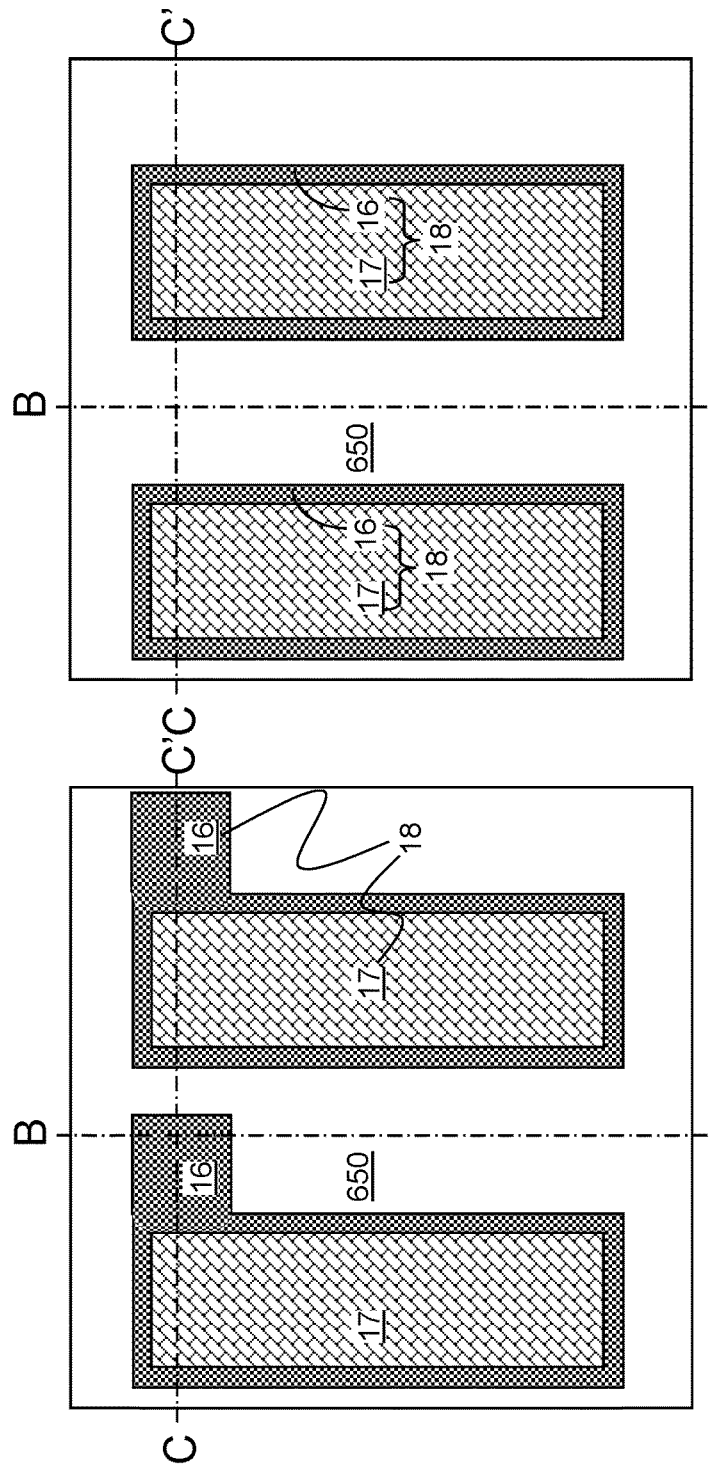
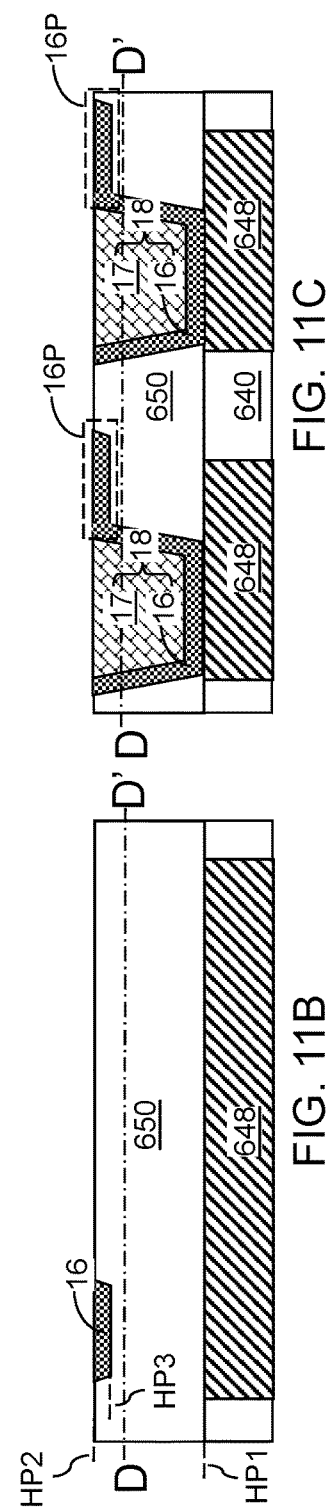
FIG. 11A  FIG. 11D
FIG. 11B  FIG. 11C

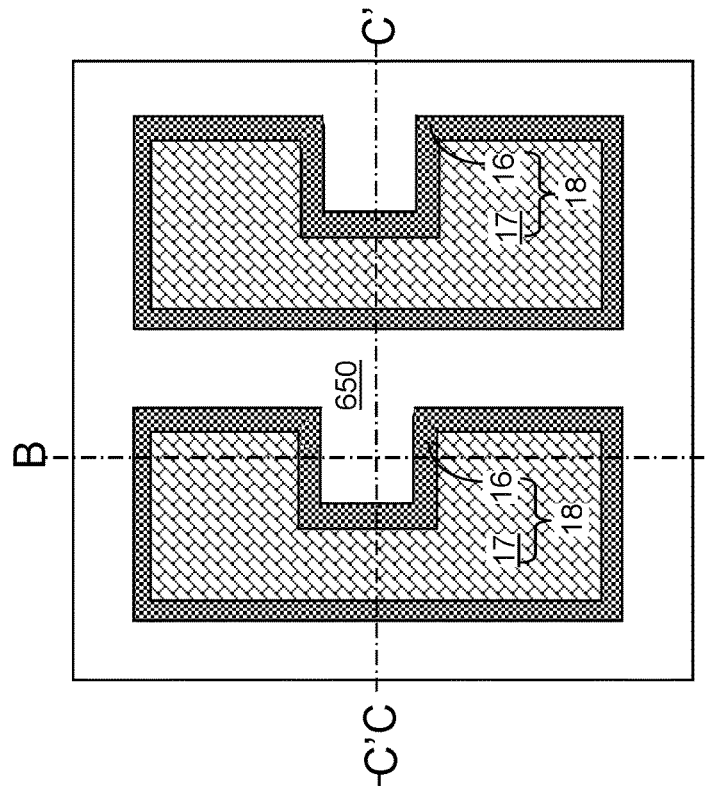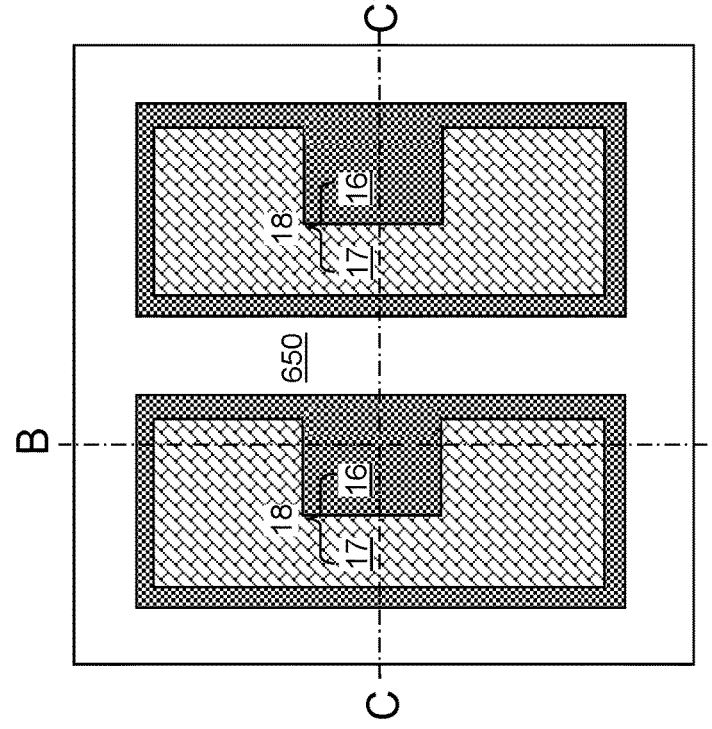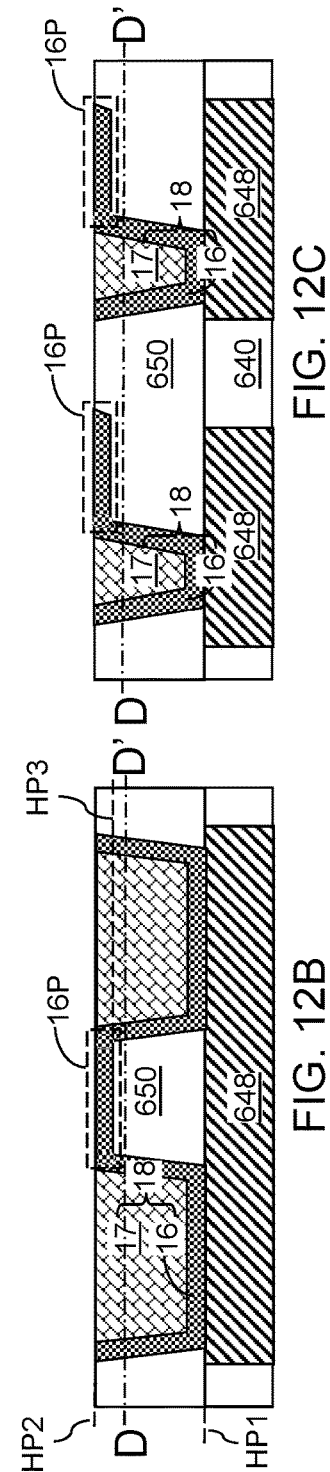

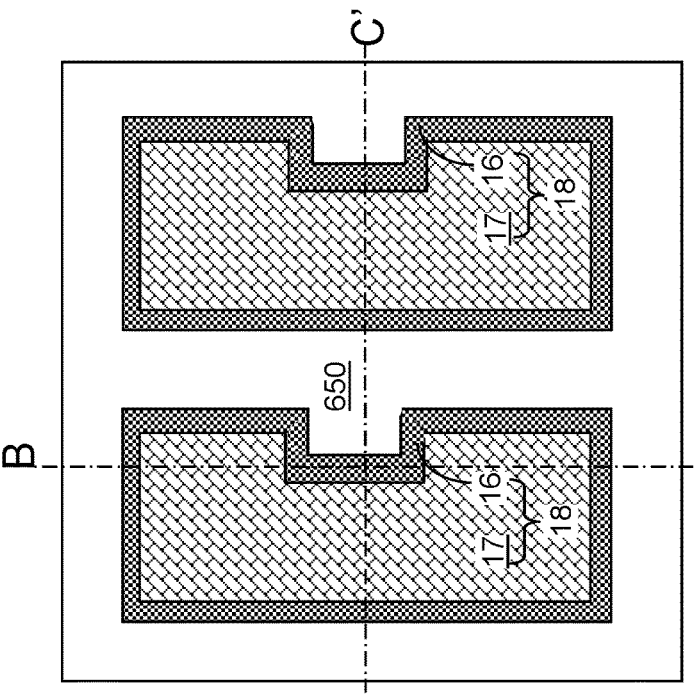
FIG. 13A
FIG. 13D
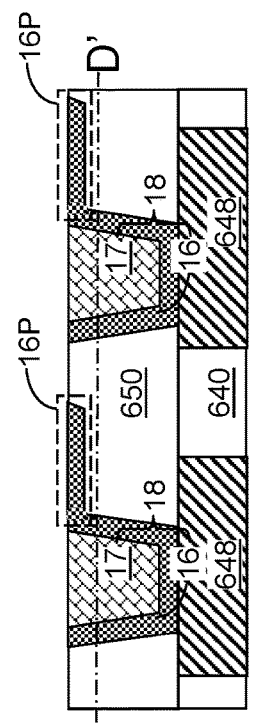
FIG. 13B
FIG. 13C

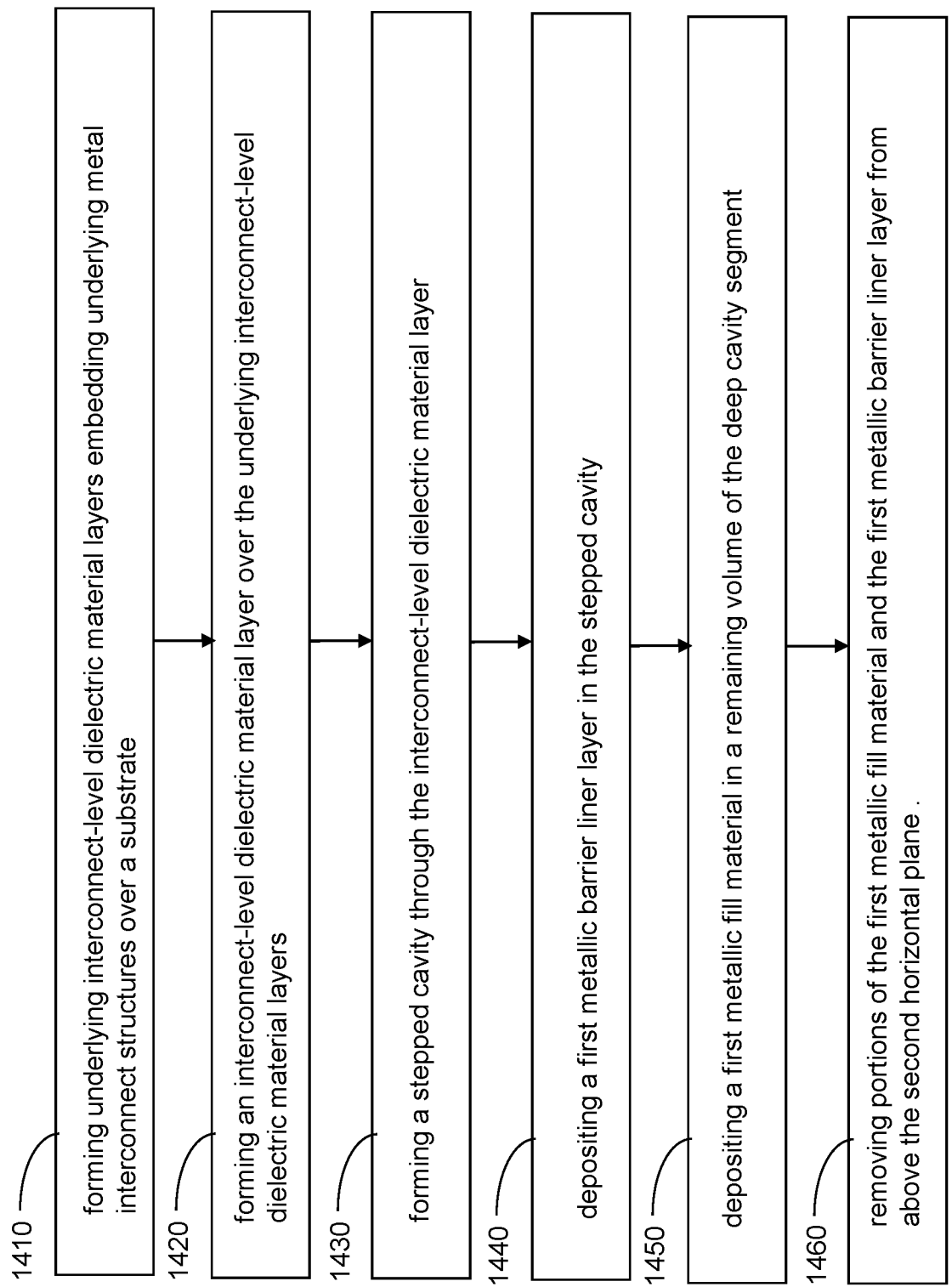

PLASMA-DAMAGE-RESISTANT INTERCONNECT STRUCTURE AND METHODS FOR FORMING THE SAME

RELATED APPLICATIONS

This application is a divisional application of U.S. application Ser. No. 17/218,435 entitled "Plasma-Damage-Resistant Interconnect Structure and Methods for Manufacturing the Same," filed on Mar. 31, 2021, the entire contents of which are incorporated herein by reference for all purposes.

BACKGROUND

Typically, an anisotropic etch process may be used to pattern openings through an overlying insulating layer. However, previously formed metal interconnect structures may suffer undesirable plasma damage during an anisotropic etch process that patterns openings through an overlying insulating layer. Such plasma damage may cause electrical failures or performance degradation in underlying electrically connected devices such as field effect transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2D are various views of a portion of the exemplary structure during formation of first shallow cavities for first stepped cavities according to an embodiment of the present disclosure. FIG. 2A is a top-down view, FIG. 2B is a vertical cross-sectional view along the vertical plane B-B' of FIGS. 2A and 2D, FIG. 2C is a vertical cross-sectional view along the vertical plane C-C' of FIGS. 2A and 2D, and FIG. 2D is a horizontal cross-sectional view along the horizontal plane D-D' of FIGS. 2B and 2C.

FIG. 3A is a top-down view, FIG. 3B is a vertical cross-sectional view along the vertical plane B-B' of FIGS. 3A and 3D, FIG. 3C is a vertical cross-sectional view along the vertical plane C-C' of FIGS. 3A and 3D, and FIG. 3D is a horizontal cross-sectional view along the horizontal plane D-D' of FIGS. 3B and 3C.

FIGS. 4A-4D are various views of a portion of the exemplary structure during formation of first stepped cavities according to an embodiment of the present disclosure. FIG. 4A is a top-down view, FIG. 4B is a vertical cross-sectional view along the vertical plane B-B' of FIGS. 4A and 4D, FIG. 4C is a vertical cross-sectional view along the vertical plane C-C' of FIGS. 4A and 4D, and FIG. 4D is a horizontal cross-sectional view along the horizontal plane D-D' of FIGS. 4B and 4C.

FIGS. 5A-5D are various views of a portion of the exemplary structure during formation of a first metallic barrier liner layer and a first metallic fill material layer according to an embodiment of the present disclosure. FIG. 5A is a top-down view, FIG. 5B is a vertical cross-sectional view along the vertical plane B-B' of FIGS. 5A and 5D, FIG. 5C is a vertical cross-sectional view along the vertical plane C-C' of FIGS. 5A and 5D, and FIG. 5D is a horizontal cross-sectional view along the horizontal plane D-D' of FIGS. 5B and 5C.

FIGS. 6A-6D are various views of a portion of the exemplary structure during formation of first stepped metal interconnect structures according to an embodiment of the present disclosure. FIG. 6A is a top-down view, FIG. 6B is a vertical cross-sectional view along the vertical plane B-B' of FIGS. 6A and 6D, FIG. 6C is a vertical cross-sectional view along the vertical plane C-C' of FIGS. 6A and 6D, and FIG. 6D is a horizontal cross-sectional view along the horizontal plane D-D' of FIGS. 6B and 6C.

FIGS. 7A-7D are various views of a portion of the exemplary structure during formation of second stepped cavities according to an embodiment of the present disclosure. FIG. 7A is a top-down view, FIG. 7B is a vertical cross-sectional view along the vertical plane B-B' of FIGS. 7A and 7D, FIG. 7C is a vertical cross-sectional view along the vertical plane C-C' of FIGS. 7A and 7D, and FIG. 7D is a horizontal cross-sectional view along the horizontal plane D-D' of FIGS. 7B and 7C.

FIGS. 8A-8D are various views of a portion of the exemplary structure during formation of second stepped metal interconnect structures according to an embodiment of the present disclosure. FIG. 8A is a top-down view, FIG. 8B is a vertical cross-sectional view along the vertical plane B-B' of FIGS. 8A and 8D, FIG. 8C is a vertical cross-sectional view along the vertical plane C-C' of FIGS. 8A and 8D, and FIG. 8D is a horizontal cross-sectional view along the horizontal plane D-D' of FIGS. 8B and 8C.

FIGS. 9A-9D are various views of a portion of the exemplary structure during formation of bonding pads according to an embodiment of the present disclosure. FIG. 9A is a top-down view, FIG. 9B is a vertical cross-sectional view along the vertical plane B-B' of FIGS. 9A and 9D, FIG. 9C is a vertical cross-sectional view along the vertical plane C-C' of FIGS. 9A and 9D, and FIG. 9D is a horizontal cross-sectional view along the horizontal plane D-D' of FIGS. 9B and 9C.

FIGS. 10A-10D are various views of a portion of a first alternative configuration of the exemplary structure during formation of bonding pads according to an embodiment of the present disclosure. FIG. 10A is a top-down view, FIG. 10B is a vertical cross-sectional view along the vertical plane B-B' of FIGS. 10A and 10D, FIG. 10C is a vertical cross-sectional view along the vertical plane C-C' of FIGS. 10A and 10D, and FIG. 10D is a horizontal cross-sectional view along the horizontal plane D-D' of FIGS. 10B and 10C.

FIGS. 11A-11D are various views of a portion of a second alternative configuration of the exemplary structure during formation of bonding pads according to an embodiment of the present disclosure. FIG. 11A is a top-down view, FIG. 11B is a vertical cross-sectional view along the vertical plane B-B' of FIGS. 11A and 11D, FIG. 11C is a vertical cross-sectional view along the vertical plane C-C' of FIGS. 11A and 11D, and FIG. 11D is a horizontal cross-sectional view along the horizontal plane D-D' of FIGS. 11B and 11C.

FIGS. 12A-12D are various views of a portion of a third alternative configuration of the exemplary structure during formation of bonding pads according to an embodiment of the present disclosure. FIG. 12A is a top-down view, FIG. 12B is a vertical cross-sectional view along the vertical plane B-B' of FIGS. 12A and 12D, FIG. 12C is a vertical cross-sectional view along the vertical plane C-C' of FIGS. 12A and 12D, and FIG. 12D is a horizontal cross-sectional view along the horizontal plane D-D' of FIGS. 12B and 12C.

FIGS. 13A-13D are various views of a portion of a fourth alternative configuration of the exemplary structure during formation of bonding pads according to an embodiment of the present disclosure. FIG. 13A is a top-down view, FIG. 13B is a vertical cross-sectional view along the vertical plane B-B' of FIGS. 13A and 13D, FIG. 13C is a vertical cross-sectional view along the vertical plane C-C' of FIGS. 13A and 13D, and FIG. 13D is a horizontal cross-sectional view along the horizontal plane D-D' of FIGS. 13B and 13C.

FIG. 14 is a flowchart that illustrates a sequence of processing steps for manufacturing a device structure of the present disclosure.

DETAILED DESCRIPTION

Figure 1:
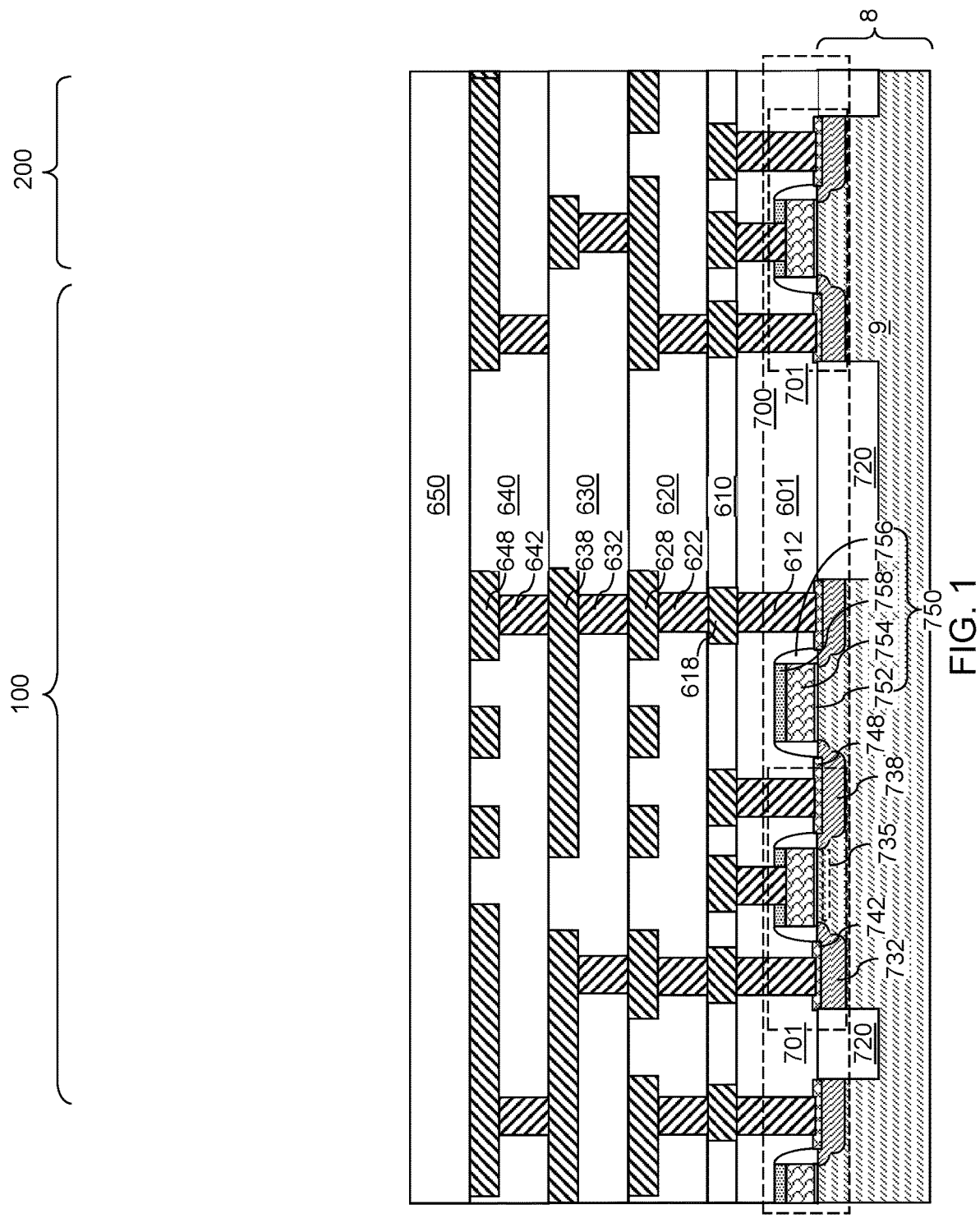
FIG. 1 is a vertical cross-sectional view of an exemplary structure after formation of complementary metal oxide-semiconductor (CMOS) transistors, metal interconnect structures embedded in dielectric material layers, and a connection-via-level dielectric layer according to an embodiment of the present disclosure.
Figure 3A:
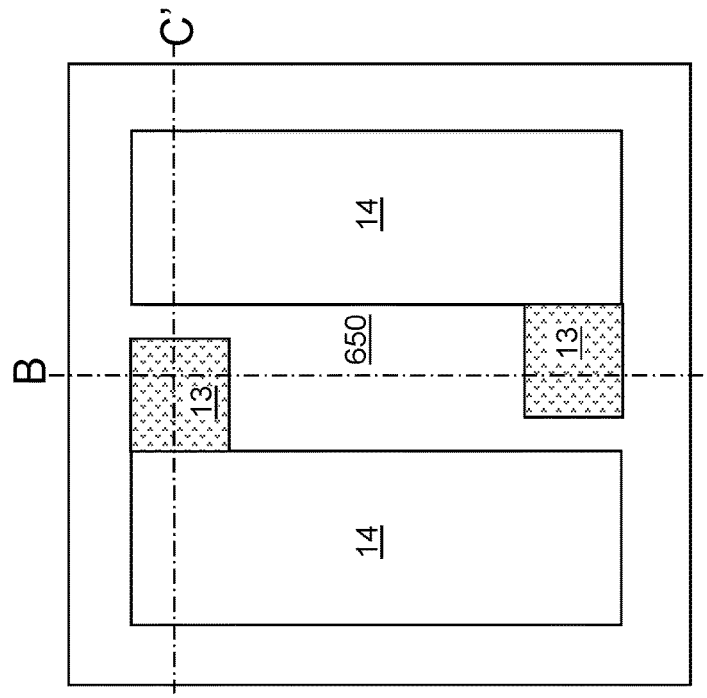
FIGS. 3A-3D are various views of a portion of the exemplary structure during formation of first deep cavities for first stepped cavities according to an embodiment of the present disclosure.
Figure 3D:
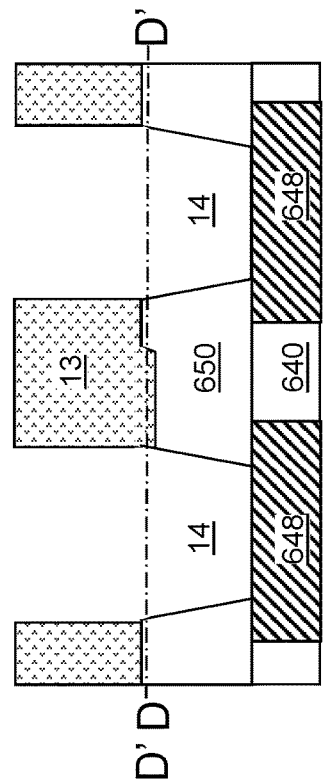
Figure 3B:
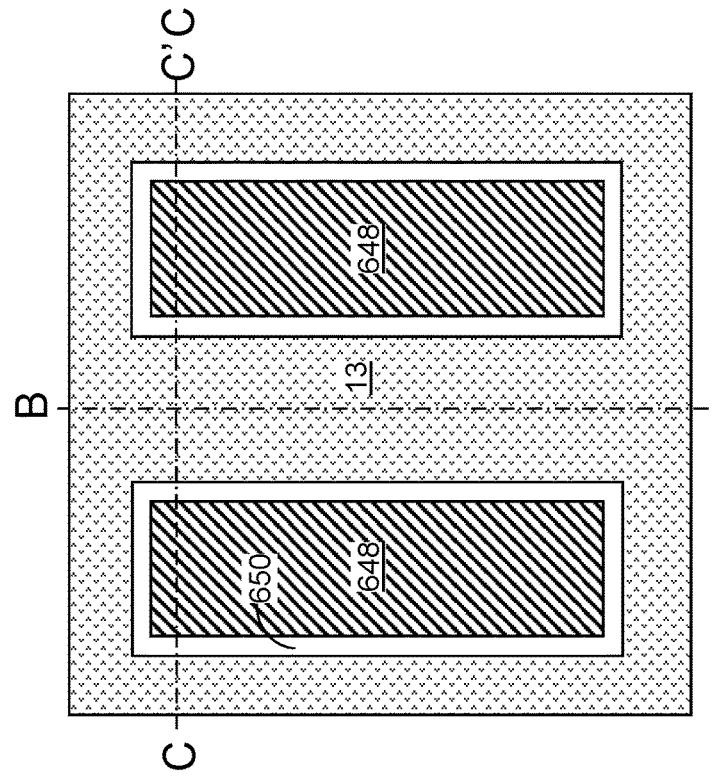
Figure 3C:
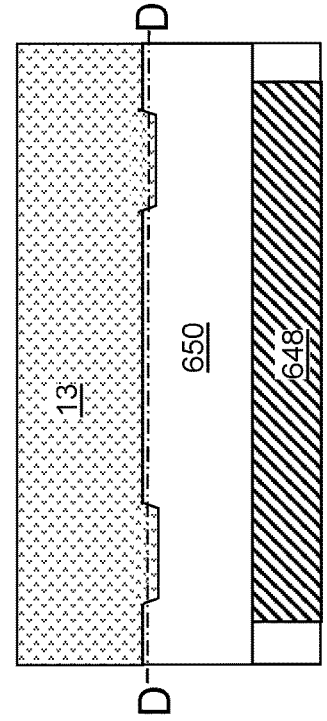
Figure 10C:
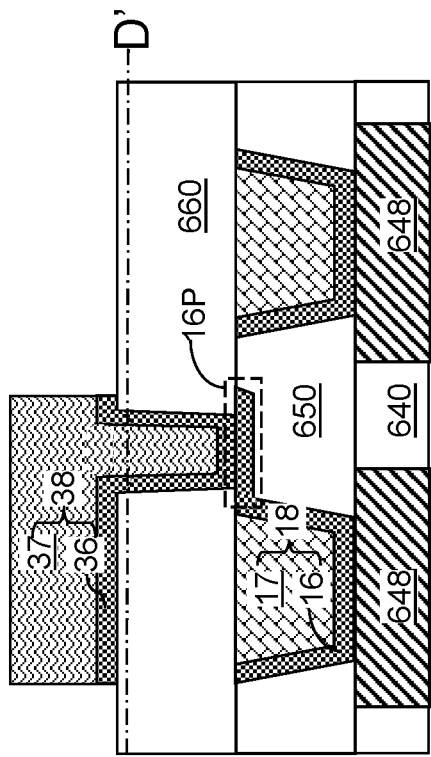
Figure 10B:
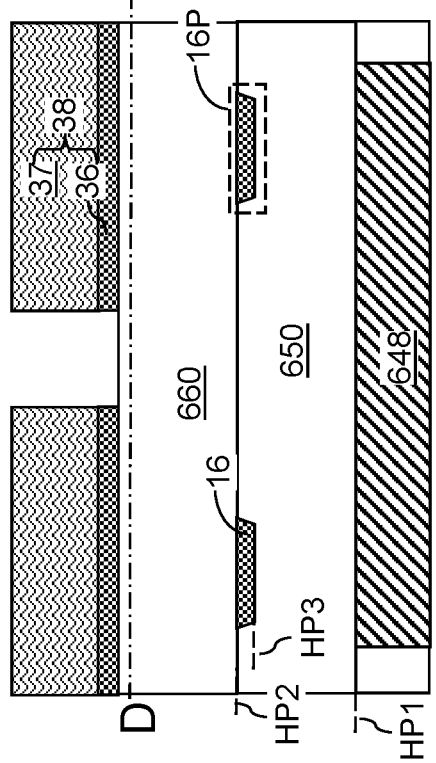

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, plasma used in anisotropic etch processes that form openings through a dielectric material layer during semiconductor manufacturing may provide collateral damage to underlying metal interconnect structures and underlying semiconductor devices such as field effect transistors. Among the adverse effects of the plasma damage from anisotropic etch processes include shift in the threshold voltage and the on-current of underlying field effect transistors.

According to an aspect of the present disclosure, plasma damage to underlying semiconductor devices and metal interconnect structures may be reduced or eliminated by physically exposing only metallic compound material portions within underlying metal interconnect structures during formation of an opening through a dielectric material layer. To provide sufficient contact area for a metal interconnect structure to be subsequently formed, stepped metal interconnect structures may be used in the underlying metal interconnect level. The stepped metal interconnect structures may be formed, for example, by forming stepped cavities having respective deep cavity and a respective shallow cavity such that the thickness of the shallow cavity is not greater than the thickness of a metallic compound material to be subsequently deposited. Thus, a laterally-protruding portion of each stepped metal interconnect structure may include a planar top barrier liner segment consisting essentially of a metallic compound material that is resistant to oxidation and provides sufficiently high electrical resistivity to avoid excessive electrical current flow into underlying semiconductor devices during a subsequent anisotropic etch process. The high resistivity of the metallic compound material reduces the antenna effect (i.e., plasma Induced gate oxide damage) during a subsequent reactive ion etch process, and reduces plasma damage during the reactive ion etch process. The various embodiment methods and structures are now described with reference to accompanying figures.

FIG. 1 is a vertical cross-sectional view of an exemplary structure after formation of complementary metal oxide-semiconductor (CMOS) transistors, metal interconnect structures formed within dielectric material layers, and a connection-via-level dielectric layer according to embodiments of the present disclosure. The exemplary structure may include complementary metal oxide-semiconductor (CMOS) transistors and metal interconnect structures formed in dielectric material layers. Specifically, the exemplary structure may include a substrate 9. The substrate 9 may be a semiconductor substrate such as a commercially available silicon wafer. Shallow cavity isolation structures 720 including a dielectric material such as silicon oxide may be formed in an upper portion of the substrate 9. Suitable doped semiconductor wells, such as p-type wells and n-type wells, may be formed within each area that may be laterally enclosed by a portion of the shallow cavity isolation structures 720. Field effect transistors may be formed over the top surface of the substrate 9. For example, each field effect transistor may include a source region 732, a drain region 738, a semiconductor channel 735 that includes a surface portion of the substrate 9 extending between the source region 732 and the drain region 738, and a gate structure 750. Each gate structure 750 may include a gate dielectric 752, a gate electrode 754, a gate cap dielectric 758, and a dielectric gate spacer 756. A source-side metal semiconductor alloy region 742 may be formed on each source region 732, and a drain-side metal semiconductor alloy region 748 may be formed on each drain region 738. While planar field effect transistors are illustrated in the drawings, embodiments are expressly contemplated herein in which the field effect transistors may additionally or alternatively include fin field effect transistors (FinFET), gate-all-around field effect (GAAFET) transistors, or any other type of field effect transistors (FETs).

The exemplary structure illustrated in FIG. 1 may include a memory array region 100 in which an array of memory elements may be subsequently formed (e.g., back-end-of-line (BEOL) devices and elements), and a peripheral region 200 in which logic devices that support operation of the array of memory elements may be formed. In one embodiment, devices (such as field effect transistors) in the memory array region 100 may include bottom electrode access transistors that provide access to bottom electrodes of memory cells to be subsequently formed. Top electrode access transistors that provide access to top electrodes of memory cells to be subsequently formed may be formed in the peripheral region 200 at this processing step. Devices (such as field effect transistors) in the peripheral region 200 may provide functions that may be needed to operate the array of memory cells to be subsequently formed. Specifically, devices in the peripheral region 200 may be configured to control the programming operation, the erase operation, and the sensing (read) operation of the array of memory cells. For example, the devices in the peripheral region 200 may include a sensing circuitry and/or a top electrode bias circuitry. The devices formed on the top surface of the substrate 9 may include complementary metal oxide-semiconductor (CMOS) transistors and optionally additional semiconductor devices (such as resistors, diodes, capacitors, etc.), and are collectively referred to as CMOS circuitry 700.

Various metal interconnect structures formed within dielectric material layers may be subsequently formed over the substrate 9 and the devices (such as field effect transistors). The dielectric material layers may include, for example, a contact-level dielectric material layer 601, a first metal line-level dielectric material layer 610, a second line-and-via-level dielectric material layer 620, a third line-and-via-level dielectric material layer 630, and a fourth line-and-via-level dielectric material layer 640. The metal interconnect structures may include device contact via structures 612 formed in the contact-level dielectric material layer 601 and contact a respective component of the CMOS circuitry 700, first metal line structures 618 formed in the first metal line-level dielectric material layer 610, first metal via structures 622 formed in a lower portion of the second line-and-via-level dielectric material layer 620, second metal line structures 628 formed in an upper portion of the second line-and-via-level dielectric material layer 620, second metal via structures 632 formed in a lower portion of the third line-and-via-level dielectric material layer 630, third metal line structures 638 formed in an upper portion of the third line-and-via-level dielectric material layer 630, third metal via structures 642 formed in a lower portion of the fourth line-and-via-level dielectric material layer 640, and fourth metal line structures 648 formed in an upper portion of the fourth line-and-via-level dielectric material layer 640.

Each of the dielectric material layers (601, 610, 620, 630, 640) may include a dielectric material such as undoped silicate glass, a doped silicate glass, organosilicate glass, amorphous fluorinated carbon, porous variants thereof, or combinations thereof. Each of the metal interconnect structures (612, 618, 622, 628, 632, 638, 642, 648) may include at least one conductive material, which may be a combination of a metallic barrier liner layer (such as a metallic nitride or a metallic carbide) and a metallic fill material. Each metallic barrier liner layer may include TiN, TaN, WN, TiC, TaC, and WC, and each metallic fill material portion may include W, Cu, Co, Ru, Mo, Ta, Ti, alloys thereof, and/or combinations thereof. Other suitable metallic barrier liner and metallic fill materials may be within the contemplated scope of disclosure. In one embodiment, the first metal via structures 622 and the second metal line structures 628 may be formed as integrated line and via structures by a dual damascene process, and/or the second metal via structures 632 and the third metal line structures 638 may be formed as integrated line and via structures, and/or the third metal via structures 642 and the fourth metal line structures 648 may be formed as integrated line and via structures.

In one embodiment, the metallic fill material portions of the metal interconnect structures (612, 618, 622, 628, 632, 638, 642, 648) may be based on a metallic element other than aluminum. In one embodiment, the metallic fill material portions of the metal interconnect structures (612, 618, 622, 628, 632, 638, 642, 648) may be copper-based. In this embodiment, the metallic fill material portions of the metal interconnect structures (612, 618, 622, 628, 632, 638, 642, 648) may include copper at an atomic percentage greater than 50%, which may be greater than 90% and/or may be greater than 98%. Generally, a set of metal interconnect structures (612, 618, 622, 628, 632, 638, 642, 648) embedded in dielectric material layers (601, 610, 620, 630) may be formed. The set of metal interconnect structures (612, 618, 622, 628, 632, 638, 642, 648) may be based on a metal other than aluminum. In one embodiment, the set of metal interconnect structures (612, 618, 622, 628, 632, 638, 642, 648) may be transition-metal based, i.e., based on a transition metal and may include the transition metal at an atomic percentage greater than 50%, such as greater than 90% and/or greater than 98%. For example, the set of metal interconnect structures (612, 618, 622, 628, 632, 638, 642, 648) may be copper-based. While the present disclosure is described using an embodiment in which three line-levels are present within transition-metal based metal interconnect structures (612, 618, 622, 628, 632, 638, 642, 648), embodiments are expressly contemplated herein in which a lesser number or a greater number of metal interconnect structures (612, 618, 622, 628, 632, 638, 642, 648) may be formed prior to formation of aluminum-based metal interconnect structures.

According to an aspect of the present disclosure, a dielectric material layer may be formed over the transition-metal based metal interconnect structures (612, 618, 622, 628, 632, 638, 642, 648). This dielectric material layer is herein referred to as a first stepped-interconnect-level dielectric material layer 650, or as a first dielectric material layer. In one embodiment, aluminum-based metal interconnect structures may be subsequently formed in the dielectric material layer. In this embodiment, the first stepped-interconnect-level dielectric material layer 650 is also referred to as a first aluminum-based-interconnect-level dielectric material layer. The first stepped-interconnect-level dielectric material layer 650 may include a dielectric material such as undoped silicate glass or a doped silicate glass, and may have a thickness in a range from 100 nm to 2,000 nm, such as from 200 nm to 1,000 nm, although lesser and greater thicknesses may also be used. The first stepped-interconnect-level dielectric material layer 650 may be deposited, for example, by chemical vapor deposition.

While the present disclosure is described using an embodiment in which the first stepped-interconnect-level dielectric material layer 650 is formed above, and on, the fourth line-and-via-level dielectric material layer 640, other embodiments are expressly contemplated herein in which the first stepped-interconnect-level dielectric material layer 650 is formed at a different level. For example, the first stepped-interconnect-level dielectric material layer 650 may be formed directly on a top surface of the first metal line-level dielectric material layer 610, directly on a top surface of a second line-and-via-level dielectric material layer 620, directly on a top surface of a third line-and-via-level dielectric material layer 630, directly on a top surface of a fourth line-and-via-level dielectric material layer 640, or directly on a top surface of any other line-and-via-level dielectric material layer (not shown) that may be formed over the fourth line-and-via-level dielectric material layer 640. Alternatively, the first stepped-interconnect-level dielectric material layer 650 may be formed on a top surface of any line-level dielectric material layer or on a top surface of any via-level dielectric material layer in embodiments in which such a line-level dielectric material layer or such a via-level dielectric material layer is used.

The first stepped-interconnect-level dielectric material layer 650 is a dielectric material layer in which first stepped metal interconnect structures are subsequently formed, and as such, is also referred to as a first dielectric material layer. Generally, the set of all dielectric material layers that underlie the first stepped-interconnect-level dielectric material layer 650 is herein referred to as underlying interconnect-level dielectric material layers. The set of all metal interconnect structures embedded in the underlying interconnect-level dielectric material layers is herein referred to as underlying metal interconnect structures. The first stepped-interconnect-level dielectric material layer 650 is an interconnect-level dielectric material layer that is formed over the underlying interconnect-level dielectric material layers.

Referring to FIGS. 2A-2D, a first photoresist layer 11 may be applied over the top surface of the first stepped-interconnect-level dielectric material layer 650. The first photoresist layer 11 may be lithographically patterned to form openings within areas in which planar top barrier liner segments of first stepped metal interconnect structures are to be subsequently formed. A first anisotropic etch process may be performed to transfer the pattern of the openings in the first photoresist layer 11 into a surface region of the first stepped-interconnect-level dielectric material layer 650.

Unmasked portions of the first stepped-interconnect-level dielectric material layer 650 are recessed relative to a horizontal plane including the top surface of the first stepped-interconnect-level dielectric material layer 650 by a first recess depth. First shallow cavities 12 may be formed in volumes from which the material of the first stepped-interconnect-level dielectric material layer 650 is removed. According to an aspect of the present disclosure, the first recess depth is equal to, or is less than the thickness of a first metallic nitride liner to be subsequently deposited. For example, the first recess depth may be in a range from 2 nm to 50 nm, such as from 5 nm to 30 nm, although lesser and greater first recess depths may also be used. Each first shallow cavity 12 may have a respective horizontal cross-sectional shape of a circle, an ellipse, a rectangle, a rounded rectangle, or any two-dimensional curvilinear shape having a closed periphery. The first photoresist layer 11 may be subsequently removed, for example, by ashing.

Referring to FIGS. 3A-3D, a second photoresist layer 13 may be applied over the top surface of the first stepped-interconnect-level dielectric material layer 650. The second photoresist layer 13 may be lithographically patterned to form openings within areas that may be adjoined to, and may be laterally offset from, a respective one of the first shallow cavities 12, which are filled with a respective remaining portion of the second photoresist layer 13. In other words, each area of the openings in the second photoresist layer 13 may be adjoined to, and may be adjacent to, an area of a respective one of the first shallow cavities 12.

A second anisotropic etch process may be performed to transfer the pattern of the openings in the second photoresist layer 13 through the first stepped-interconnect-level dielectric material layer 650. Unmasked portions of the first stepped-interconnect-level dielectric material layer 650 may be etched during the second anisotropic etch process down to a top surface of a respective one of the underlying metal interconnect structures (such as a respective one of the fourth metal line structures 648). First deep cavities 14 may be formed in volumes from which the material of the first stepped-interconnect-level dielectric material layer 650 is removed.

According to an aspect of the present disclosure, the each first deep cavity 14 may be formed adjacent to a respective one of the first shallow cavities 12 such that a bottom surface of the respective one of the first shallow cavities 12 is adjoined to a sidewall of each first deep cavity 14. A top surface of an underlying metal interconnect structures (such as a fourth metal line structure 648) may be physically exposed underneath each first deep cavity 14. In one embodiment, an entirety of a bottom surface of a first deep cavity 14 may be located within, and may be laterally offset inward from, a periphery of an underlying metal interconnect structures (such as a fourth metal line structure 648). Each first deep cavity 14 may have at least one sidewall (such as a plurality of sidewalls) that vertically extends from a bottom surface of the first stepped-interconnect-level dielectric material layer 650 to a topmost surface of the first stepped-interconnect-level dielectric material layer 650, and a sidewall that vertically extends from a bottom surface of the first stepped-interconnect-level dielectric material layer 650 to a recessed surface of the first stepped-interconnect-level dielectric material layer 650 that is a bottom surface of a respective one of the first shallow cavities 12. The bottom surface of each first deep cavity 14 may be located at the horizontal plane including the bottom surface of the first stepped-interconnect-level dielectric material layer 650, or may be located below the horizontal plane including the bottom surface of the first stepped-interconnect-level dielectric material layer 650 in embodiments in which top surfaces of the underlying metal interconnect structures (such as a fourth metal line structure 648) are collaterally recessed during the second anisotropic etch process. The second photoresist layer 13 may be subsequently removed, for example, by ashing.

While the present disclosure is described employing an embodiment in which the first shallow cavities 12 are formed prior to formation of the first deep cavities 14, embodiments are expressly contemplated herein in which the first deep cavities 14 are formed prior to formation of the first shallow cavities 12. In other words, the order of the processing steps of FIGS. 2A-2D and the processing steps of FIGS. 3A-3D may be optionally reversed.

Referring to FIGS. 4A-4D, the exemplary structure is illustrated after removal of the second photoresist layer 13. Each contiguous volume that includes a volume of a first shallow cavity 12 and a first deep cavity 14 constitutes a first stepped cavity 15. Surfaces of a first stepped cavity 15 comprises a bottom surface of a first shallow cavity 12 which is a recessed surface of the first stepped-interconnect-level dielectric material layer 650, a bottom surface at which an underlying metal interconnect structure (such as a fourth metal line structure 648) may be physically exposed, at least one sidewall (which may comprise a plurality of sidewalls or a single curved sidewall) vertically extending from a respective portion of a bottom periphery of the bottom surface to a top surface of the first stepped-interconnect-level dielectric material layer 650, a sidewall vertically extending from a respective portion of the bottom periphery of the bottom surface to an edge of the recessed surface, and at least one recess sidewall vertically extending from a periphery of the recessed surface of the first stepped-interconnect-level dielectric material layer 650 to a top surface of the first stepped-interconnect-level dielectric material layer 650.

In one embodiment, each first shallow cavity 12 of a first stepped cavity 15 may have a tab configuration such that the area of the first shallow cavity 12 is adjoined to an outer periphery of a polygonal shape, a circular shape, or an elliptical shape of the first deep cavity 14. In one embodiment, the first deep cavity 14 of a first stepped cavity 15 may have a horizontal cross-sectional shape of a rectangle or a rounded rectangle, and the first shallow cavity 12 of the first stepped cavity 15 may have a horizontal cross-sectional shape of another rectangle or another rounded rectangle.

Generally, a first stepped cavity 15 may be formed through the first stepped-interconnect-level dielectric material layer 650. The first stepped cavity 15 comprises a first deep cavity 14 vertically extending at least from a first horizontal plane HP1 including a bottom surface of the first stepped-interconnect-level dielectric material layer 650 (which is an interconnect-level dielectric material layer) to a second horizontal plane HP2 including a top surface of the first stepped-interconnect-level dielectric material layer 650, and a first shallow cavity 12 vertically extending from a third horizontal plane HP3 located between the first horizontal plane and the second horizontal plane to the second horizontal plane HP2.

Referring to FIGS. 5A-5D, a first metallic barrier liner layer 16L and a first metallic fill material layer 17L may be sequentially deposited in the first stepped cavities 15 and over the top surface of the first stepped-interconnect-level dielectric material layer 650. According to an aspect of the present disclosure, the thickness of horizontally-extending portions of the first metallic barrier liner layer 16L may be the same as, or may be greater than, the vertical distance between the third horizontal plane HP3 and the second horizontal plane HP2. Thus, the thickness of horizontally-extending portions of the first metallic barrier liner layer 16L may be the same as, or may be greater than, the first recess distance by which bottom surfaces of the first shallow cavities 12 are vertically recessed relative to the top surface of the first stepped-interconnect-level dielectric material layer 650 at the processing steps of FIGS. 2A-2D. Thus, the first metallic barrier liner layer 16L may fill an entire volume of each first shallow cavity 12 and a peripheral region of each first deep cavity 14.

In one embodiment, the first metallic barrier liner layer 16L comprises, and/or consists essentially of, a conductive metallic compound material, at least one refractory metal, or a stack there of. In an illustrative example, the first metallic barrier liner layer 16L may comprise, and/or may consist essentially of, a conductive metallic compound material of at least one metal element and at least one non-metal element such as TiN, TaN, WN, TiC, TaC, or WC. Alternatively or additionally, the first metallic barrier liner layer 16L may include at least one refractory metal such as tungsten, tantalum, niobium, molybdenum, and rhenium, which may function as an effective diffusion barrier due to a high melting point (which is greater than 2,000 degrees Celsius). Alternatively or additionally, the first metallic barrier liner layer 16L may include titanium. The first metallic barrier liner layer 16L may be deposited by physical vapor deposition or chemical vapor deposition. The thickness of the first metallic barrier liner layer 16L may be in a range from 5 nm to 100 nm, such as from 10 nm to 50 nm, although lesser and greater thicknesses may also be used.

The first metallic fill material layer 17L includes a first metallic fill material in remaining volumes of the first deep cavities 14 and over the first stepped-interconnect-level dielectric material layer 650. The first metallic fill material has a different material composition than the first metallic barrier liner layer 16L, and may include a metallic material having lesser hardness (for example, as measured by Young's modulus) and a lower melting point than the material of the first metallic barrier liner layer 16L. In one embodiment, the first metallic fill material may comprise, and/or may consist essentially of, a material selected from aluminum, an aluminum-containing alloy including aluminum at a weight percentage greater than 90%, copper, a copper-containing alloy including copper at a weight percentage greater than 50%, tungsten, molybdenum, ruthenium, cobalt, nickel, silver, gold, and intermetallic alloys thereof. In one embodiment, the first metallic fill material layer 17L may include, and/or may consist essentially of, an aluminum-containing alloy including aluminum at an atomic percentage, which may be in a range from 90% to 100%. In this case, the aluminum-containing alloy may include copper and/or silicon. In one embodiment, the aluminum-containing alloy may be an aluminum-copper alloy, an aluminum-silicon alloy, or an aluminum-copper-silicon alloy. In one embodiment, the atomic percentage may be in a range from 95% to 99.99%, such as from 98% to 99.9% and/or from 99.0% to 99.8%. The thickness of the first metallic fill material layer 17L over the top surface of the first metallic barrier liner layer 16L may be in a range from 100 nm to 2,000 nm, such as from 200 nm to 1,000 nm, although lesser and greater thicknesses may also be used.

Referring to FIGS. 6A-6D, portions of the first metallic fill material of the first metallic fill material layer 17L and the material of the first metallic barrier liner layer 16L may be removed from above the second horizontal plane HP2 by performing a chemical mechanical polishing (CMP) process. The top surface of the first stepped-interconnect-level dielectric material layer 650 may be used as a stopping surface during the CMP process. Remaining portions of the first metallic fill material layer 17L and the first metallic barrier liner layer 16L comprise first stepped metal interconnect structures 18. Each first stepped metal interconnect structure 18 includes a combination of a first metallic barrier liner 16 and a first metallic fill material portion 17. Each first metallic barrier liner 16 comprises a patterned remaining portion of the first metallic barrier liner layer 16L. Each first metallic fill material portion 17 comprises a patterned remaining portion of the first metallic fill material layer 17L.

Within each first stepped metal interconnect structure 18, each first metallic barrier liner 16 comprises a planar bottom barrier liner segment 16B underlying the first metallic fill material portion 17 and having a bottom surface located at, or below, the first horizontal plane HP1, sidewall segments 16S adjoined to a periphery of the planar bottom barrier liner segment 16B and vertically extending to the second horizontal plane HP2, and a planar top barrier liner segment 16P adjoined to an outer sidewall of one of the sidewall segments 16S, having a top surface located within the second horizontal plane HP2, and laterally extending by a greater lateral distance than a lateral thickness of each of the sidewall segments 16S. The planar top barrier liner segment 16P has a same thickness as, or has a lesser thickness than, the planar bottom barrier liner segment 16B. The difference between the thickness of the planar bottom barrier liner segment 16B and the thickness of the planar top barrier liner segment 16P may be in a range from 1 nm to 25 nm, such as from 3 nm to 10 nm, although lesser and greater differences may also be employed. In one embodiment, the planar top barrier liner segment 16P The thickness of the planar bottom barrier liner segment 16B may be in a range from 2 nm to 50 nm, such as from 5 nm to 30 nm, although lesser and greater first recess depths may also be used. The thickness of the planar top barrier liner segment 16P may be in a range from 1 nm to 40 nm, such as from 4 nm to 25 nm, although lesser and greater first recess depths may also be used. In one embodiment, the ratio of the thickness of the planar top barrier liner segment 16P to the thickness of the planar bottom barrier liner segment 16B may be in a range from 0.5 to 1.0, such as from 0.6 to 0.95, and/or from 0.7 to 0.9.

In one embodiment, the first metallic fill material portion 17 within each first stepped metal interconnect structure 18 has a different material composition than the first metallic barrier liner 16, and comprises a material selected from aluminum, an aluminum-containing alloy including aluminum at a weight percentage greater than 90%, copper, a copper-containing alloy including copper at a weight percentage greater than 50%, tungsten, molybdenum, ruthenium, cobalt, nickel, silver, gold, and intermetallic alloys thereof. In one embodiment, an underlying dielectric material layer (such as a fourth line-and-via-level dielectric material layer 640) may contact a bottom surface of the first stepped-interconnect-level dielectric material layer 650. A metal interconnect structure (such as a fourth metal line structure 648) embedded in the underlying dielectric material layer may contact a bottom surface of the planar bottom barrier liner segment 16B of the first stepped metal interconnect structure 18 (which is also referred to as a first metal interconnect structure).

Referring to FIGS. 7A-7D, a second stepped-interconnect-level dielectric material layer 660 (which is also referred to as a second dielectric material layer) may be formed over the first stepped-interconnect-level dielectric material layer 650. In one embodiment aluminum-based metal interconnect structures may be subsequently formed in the dielectric material layer. In this embodiment, the second stepped-interconnect-level dielectric material layer 660 is also referred to as a second aluminum-based-interconnect-level dielectric material layer. The second stepped-interconnect-level dielectric material layer 660 may include a dielectric material such as undoped silicate glass or a doped silicate glass, and may have a thickness in a range from 100 nm to 2,000 nm, such as from 200 nm to 1,000 nm, although lesser and greater thicknesses may also be used. The second stepped-interconnect-level dielectric material layer 660 may be deposited, for example, by chemical vapor deposition.

The processing steps of FIGS. 2A-2D, 3A-3D, and 4A-4D may be performed mutatis mutandis to form second stepped cavities 25. Each of the second stepped cavities 25 may include a respective second shallow cavity 22 and a second deep cavity 24. According to an aspect of the present disclosure, an entirety of the bottom surface of each second deep cavity 24 may be located within a top surface of a respective one of the first metallic barrier liners 16.

The second stepped-interconnect-level dielectric material layer 660 includes a dielectric material in which second stepped metal interconnect structures are subsequently formed, and as such, is also referred to as a second dielectric material layer. Surfaces of a second stepped cavity 25 comprises a bottom surface of a second shallow cavity 22 which may be a recessed surface of the second stepped-interconnect-level dielectric material layer 660, a bottom surface at which a planar top barrier liner segment 16P of a first metallic barrier liner 16 is physically exposed, at least one sidewall (which may comprise a plurality of sidewalls or a single curved sidewall) vertically extending from a respective portion of a bottom periphery of the bottom surface to a top surface of the second stepped-interconnect-level dielectric material layer 660, a sidewall vertically extending from a respective portion of the bottom periphery of the bottom surface to an edge of the recessed surface, and at least one recess sidewall vertically extending from a periphery of the recessed surface of the second stepped-interconnect-level dielectric material layer 660 (underlying a second shallow cavity 22) to a top surface of the second stepped-interconnect-level dielectric material layer 660.

In one embodiment, each second shallow cavity 22 of a second stepped cavity 25 may have a tab configuration such that the area of the second shallow cavity 22 is adjoined to an outer periphery of a polygonal shape, a circular shape, or an elliptical shape of the second deep cavity 24. In one embodiment, the second deep cavity 24 of a second stepped cavity 25 may have a horizontal cross-sectional shape of a rectangle or a rounded rectangle, and the second shallow cavity 22 of the second stepped cavity 25 may have a horizontal cross-sectional shape of another rectangle or another rounded rectangle. Generally, a second stepped cavity 25 may be formed through the second stepped-interconnect-level dielectric material layer 660.

Referring to FIGS. 8A-8D, the processing steps of FIGS. 5A-5D and 6A-6D may be performed mutatis mutandis to form second stepped metal interconnect structure 28. For example, a second metallic barrier liner layer and a second metallic fill material layer may be sequentially deposited in the second stepped cavities 25 and over the top surface of the second stepped-interconnect-level dielectric material layer 660. According to an aspect of the present disclosure, the thickness of horizontally-extending portions of the second metallic barrier liner layer may be the same as, or may be greater than, a second recess distance by which bottom surfaces of the second shallow cavities 22 are vertically recessed relative to the top surface of the second stepped-interconnect-level dielectric material layer 660. The second metallic barrier liner layer may comprise, and/or may consist essentially of, any conductive material that may be used for the first metallic barrier liner 16. The second metallic fill material layer may comprise, and/or may consist essentially of, any conductive material that may be used for the first metallic fill material layer 17L.

Portions of the second metallic fill material layer and the second metallic barrier liner layer may be removed from above the horizontal plane including the top surface of the second stepped-interconnect-level dielectric material layer 660 by performing a chemical mechanical polishing (CMP) process. The top surface of the second stepped-interconnect-level dielectric material layer 660 may be used as a stopping surface during the CMP process. Remaining portions of the second metallic fill material layer and the second metallic barrier liner layer comprise second stepped metal interconnect structures 28. Each second stepped metal interconnect structure 28 includes a combination of a second metallic barrier liner 26 and a second metallic fill material portion 27. Each second metallic barrier liner 26 comprises a patterned remaining portion of the second metallic barrier liner layer. Each second metallic fill material portion 27 comprises a patterned remaining portion of the second metallic fill material layer.

Generally, an overlying dielectric material layer (such as a second stepped-interconnect-level dielectric material layer 660) may be formed over a dielectric material layer (such as the first stepped-interconnect-level dielectric material layer 650) embedding first stepped metal interconnect structures 18. A second stepped metal interconnect structure 28 (which may also be referred to as a second metal interconnect structure) may be formed in a cavity in the overlying dielectric material layer on a top surface of the first metal interconnect structure (such as the first stepped metal interconnect structures 18) embedded within the dielectric material layer (such as the first stepped-interconnect-level dielectric material layer 650). In one embodiment, the second metal interconnect structure contacts a top surface of the planar top barrier liner segment 16P of the first stepped metal interconnect structure 18, and does not contact the first metallic fill material portion 17 of the first stepped metal interconnect structure 18. In one embodiment, the entirety of a top surface of the first metallic fill material portion 17 may be in contact with a bottom surface of the overlying dielectric material layer (such as the second stepped-interconnect-level dielectric material layer 660).

Referring to FIGS. 9A-9D, a pad-level dielectric material layer 670 may be deposited over the second stepped-interconnect-level dielectric material layer 660. Pad-level cavities may be formed through the pad-level dielectric material layer 670 such that a surface of a planar top barrier liner segment of a second stepped metal interconnect structure 28 is physically exposed at the bottom of each pad-level cavity through the pad-level dielectric material layer 670.

A pad-level metallic barrier liner layer and a pad-level metallic fill material layer may be sequentially deposited in the pad-level cavities and over the top surface of the pad-level dielectric material layer 670. The pad-level metallic barrier liner layer may comprise, and/or may consist essentially of, any conductive material that may be used for the first metallic barrier liner 16. The pad-level metallic fill material layer may comprise, and/or may consist essentially of, a material selected from aluminum, an aluminum-containing alloy including aluminum at a weight percentage greater than 90%, copper, a copper-containing alloy including copper at a weight percentage greater than 50%, tungsten, molybdenum, ruthenium, cobalt, nickel, silver, gold, and intermetallic alloys thereof. In one embodiment, the pad-level metallic fill material layer may include, and/or may consist essentially of, an aluminum-containing alloy including aluminum at an atomic percentage, which may be in a range from 90% to 100%. In one embodiment, the atomic percentage may be in a range from 95% to 99.99%, such as from 98% to 99.9% and/or rom 99.0% to 99.8%. The thickness of the pad-level metallic fill material layer over the top surface of the pad-level metallic barrier liner layer may be in a range from 500 nm to 5,000 nm, such as from 1,000 nm to 3,000 nm, although lesser and greater thicknesses may also be used.

A photoresist layer (not shown) may be applied over the pad-level metallic fill material layer, and may be lithographically patterned to cover discrete portions of the pad-level metallic fill material layer. An anisotropic etch process may be performed to remove unmasked portions of the pad-level metallic fill material layer and the pad-level metallic barrier liner layer. The pad-level dielectric material layer 670 may be used as an etch stop layer. Remaining portions of the pad-level metallic fill material layer and the pad-level metallic barrier liner layer comprise bonding pads 38, which may be used for wire bonding. A lead wire (not shown) may be subsequently bonded to each of the bonding pads 38. Each bonding pad 38 includes a combination of a pad-level metallic barrier liner 36 and a pad-level metallic fill material portion 37. Each pad-level metallic barrier liner 36 comprises a patterned remaining portion of the pad-level metallic barrier liner layer. Each pad-level metallic fill material portion 37 comprises a patterned remaining portion of the pad-level metallic fill material layer.

Generally, an overlying dielectric material layer (such as a pad-level dielectric material layer 670) may be formed over a dielectric material layer (such as the second stepped-interconnect-level dielectric material layer 660) embedding stepped metal interconnect structures (such as second stepped metal interconnect structures 28). A bonding pad 38 may be formed in, and over, a cavity in the dielectric material layer on a top surface of a stepped metal interconnect structure (such as the second stepped metal interconnect structures 28) embedded within the dielectric material layer (such as the second stepped-interconnect-level dielectric material layer 660). In one embodiment, the bonding pad 38 contacts a top surface of the planar top barrier liner segment of the second stepped metal interconnect structure 28, and does not contact the second metallic fill material portion of the second stepped metal interconnect structure 28. In one embodiment, the entirety of a top surface of the second metallic fill material portion 27 may be in contact with a bottom surface of the overlying dielectric material layer (such as the pad-level dielectric material layer 670).

Referring to FIGS. 10A-10D, a first alternative configuration of the exemplary structure is illustrated, which may be derived from the exemplary structure of FIGS. 9A-9D by omitting the second stepped metal interconnect structure 28 and the second stepped-interconnect-level dielectric material layer 660, and by modifying the layout of the bonding pads 38 and/or the first stepped metal interconnect structures 18 such that a bottom surface of each bonding pad 38 contacts a planar top barrier liner segment 16P of a first metallic barrier liner 16.

Generally, an overlying dielectric material layer (such as a pad-level dielectric material layer 670) may be formed over a dielectric material layer (such as the first stepped-interconnect-level dielectric material layer 650) embedding stepped metal interconnect structures (such as the first stepped metal interconnect structures 18). A bonding pad 38 may be formed in, and over, a cavity in the dielectric material layer on a top surface of a stepped metal interconnect structure (such as a first stepped metal interconnect structure 18) embedded within the dielectric material layer (such as the first stepped-interconnect-level dielectric material layer 650). In one embodiment, the bonding pad 38 contacts a top surface of the planar top barrier liner segment 16P of the first stepped metal interconnect structure 18, and does not contact the first metallic fill material portion of the first stepped metal interconnect structure 18. In one embodiment, the entirety of a top surface of the first metallic fill material portion 17 may be in contact with a bottom surface of the overlying dielectric material layer (such as the pad-level dielectric material layer 670).

Various layouts may be used for the first stepped metal interconnect structures 18 and/or for the second stepped metal interconnect structures 28. Generally, each shallow cavity (12 or 22) within a stepped cavity (15 or 25) is formed adjacent to, and is adjoined to, a respective deep cavity (14 or 24) such that a shallow cavity (12 or 22) is connected to a deep cavity (14 or 24) upon formation of a stepped cavity (15 or 25). In one embodiment, a pair of first stepped metal interconnect structures 18 may be formed with a two-fold rotational symmetry around a vertical axis passing through a geometrical center of the pair of first stepped metal interconnect structures 18 as illustrated in FIG. 6A. In this embodiment, each planar top barrier liner segment 16P laterally extends from a first metallic fill material portion 17 toward the other first metallic fill material portion 17.

Referring to FIGS. 11A-11D, a second alternative configuration of the exemplary structure may be derived from the exemplary structure by arranging multiple first stepped metal interconnect structures 18 as a one-dimensional periodic array that is repeated along a horizontal direction. In this embodiment, each planar top barrier liner segment 16P laterally extends from a first metallic fill material portion 17 along a same horizontal direction.

In the configurations of FIGS. 9A-9D, 10A-10D, and 11A-11D, a second metal interconnect structure (such as a second stepped metal interconnect structure 28 or a bonding pad 38) may contact a planar top barrier liner segment 16P of the first metal interconnect structure (such as a first stepped metal interconnect structure 18). In one embodiment, an outer periphery of a top surface of the first metallic fill material portion 17 is located within the second horizontal plane, and has a rectangular shape, and an entirety of a bottom surface of the second metal interconnect structure is located outside an area of the rectangular shape, and does not contact any first metallic fill material portion 17.

Referring to FIGS. 12A-12D, a third alternative configuration of the exemplary structure may be derived from the configuration of FIGS. 9A-9D or from the configuration of FIGS. 10A-10D by forming a first shallow cavity 12 inside a rectangular area. The area of a first deep cavity 14 may be the complement of the area of the first shallow cavity 12 within the rectangular area. Thus, the entire area of a first stepped cavity 15 may be a rectangular area. In one embodiment, the area of the first shallow cavity 12 may be adjoined to a side of the rectangle that defines the rectangular area of the first stepped cavity 15.

In the configuration of FIGS. 12A-12D, an outer periphery of a top surface of the first metallic fill material portion 17 of a first stepped metal interconnect structure 18 is located within the second horizontal plane HP2, and has an indented rectangular shape that is derived from a rectangular shape by removing an indentation area that is adjoined to a side of the rectangular shape. An entirety of a bottom surface of the second metal interconnect structure (such as a second stepped metal interconnect structure 28 or a bonding pad 38) is located within the indentation area.

Referring to FIGS. 13A-13D, a fourth alternative configuration of the exemplary structure may be derived from the configuration of FIGS. 9A-9D or from the configuration of FIGS. 10A-10D by forming a first shallow cavity 12 such that the area of the first shape cavity straddles a rectangular area. In other words, a portion of the first shallow cavity 12 may be located within the rectangular area, and another portion of the first shallow cavity 12 may be located outside the rectangular area. The area of a first deep cavity 14 may be the complement of the area of the first shallow cavity 12 within the rectangular area. Thus, the entire area of a first stepped cavity 15 may be the union of a rectangular area and the area of the first shallow cavity 12, and is larger than the rectangular area.

In one embodiment, an outer periphery of a top surface of the first metallic fill material portion 17 is located within the second horizontal plane HP2, and has an indented rectangular shape that is derived from a rectangular shape by removing an indentation area that is adjoined to a side of the rectangular shape. A second metal interconnect structure (such as a second stepped metal interconnect structure 28 or a bonding pad 38) may be embedded in an overlying dielectric material layer (such as a second stepped-interconnect-level dielectric material layer 660 or a pad-level dielectric material layer 670) and may contact a top surface of the first metallic barrier liner 16. An entirety of a top surface the first metallic fill material portion 17 contacts a bottom surface of the overlying dielectric material layer. A first portion of a bottom surface of the second metal interconnect structure (such as a second stepped metal interconnect structure 28 or a bonding pad 38) is located within the indentation area; and a second portion of the bottom surface of second metal interconnect structure is located outside an area of the rectangular shape and within an area that is adjacent to the indentation area.

Referring to FIG. 14, a flowchart illustrates a sequence of processing steps for manufacturing a device structure of the present disclosure. Referring to step 1410 and FIG. 1, underlying interconnect-level dielectric material layers (601, 610, 620, 630, 640) embedding underlying metal interconnect structures (612, 618, 622, 628, 632, 638, 642, 648) may be formed over a substrate 8. Referring to step 1420 and FIG. 1, an interconnect-level dielectric material layer (such as a first stepped-interconnect-level dielectric material layer 650) may be formed over the underlying interconnect-level dielectric material layers (601, 610, 620, 630, 640). Referring to step 1430 and FIGS. 2A-4D, a stepped cavity (such as a first stepped cavity 15) may be formed through the interconnect-level dielectric material layer. The stepped cavity comprises a deep cavity (such as a first deep cavity 14) vertically extending from a first horizontal plane HP1 including a bottom surface of the interconnect-level dielectric material layer to a second horizontal plane HP2 including a top surface of the interconnect-level dielectric material layer and a shallow cavity (such as a first shallow cavity 12) vertically extending from a third horizontal plane HP3 located between the first horizontal plane HP1 and the second horizontal plane HP2 to the second horizontal plane HP2.

Referring to step 1440 and FIGS. 5A-5D, a first metallic barrier liner layer 16L may be deposited in the stepped cavity. The first metallic barrier liner layer 16L fills an entire volume of the shallow cavity and a peripheral region of the deep cavity. Referring to step 1450 and FIGS. 5A-5D, a first metallic fill material (comprising a first metallic fill material layer 17L) may be deposited in a remaining volume of the deep cavity. Referring to step 1460 and FIGS. 6A-13D, portions of the first metallic fill material and the first metallic barrier liner layer 16L may be removed from above the second horizontal plane HP2 by performing a planarization process such as a chemical mechanical polishing process. A first stepped metal interconnect structure 18 including a first metallic barrier liner 16 and a first metallic fill material portion 17 is formed in the stepped cavity. The first metallic barrier liner 16 includes a remaining portion of the first metallic barrier liner layer 16L, and the first metallic fill material portion 17 includes a remaining portion of the first metallic fill material.

Referring to all drawings and according to various embodiments of the present disclosure, a device structure is provided, which comprises: an interconnect-level dielectric material layer (such as a first stepped-interconnect-level dielectric material layer 650) located over a substrate 8; and a first metal interconnect structure (such as a first stepped metal interconnect structure 18) embedded in the interconnect-level dielectric material layer and comprising a first metallic barrier liner 16 and a first metallic fill material portion 17, wherein the first metallic barrier liner 16 comprises a planar bottom barrier liner segment 16B underlying the first metallic fill material portion 17 and having a bottom surface located at, or below, a first horizontal plane HP1 including a bottom surface of interconnect-level dielectric material layer, sidewall segments 16S adjoined to a periphery of the planar bottom barrier liner segment 16B and vertically extending to a second horizontal plane HP2 including a top surface of the interconnect-level dielectric material layer, and a planar top barrier liner segment 16P adjoined to an outer sidewall of one of the sidewall segments 16S, having a top surface located within the second horizontal plane HP2, and laterally extending by a greater lateral distance than a lateral thickness of each of the sidewall segments 16S. The lateral thickness of a sidewall segment 16S refers to a lateral distance between an inner sidewall and an outer sidewall.

In one embodiment, the device structure comprises: an overlying dielectric material layer (such as a second stepped-interconnect-level dielectric material layer 660 or a pad-level dielectric material layer 670) that contacts a top surface of the interconnect-level dielectric material layer (such as the first stepped-interconnect-level dielectric material layer 650); and a second metal interconnect structure (such as a second stepped metal interconnect structure 28 or a bonding pad 38) embedded in the overlying dielectric material layer and contacting a top surface of the first metal interconnect structure. In one embodiment, the second metal interconnect structure contacts a top surface of the planar top barrier liner segment 16P of the first stepped metal interconnect structure 18, and does not contact the first metallic fill material portion 17.

In one embodiment, an entirety of a top surface of the first metallic fill material portion 17 contacts a bottom surface of the overlying dielectric material layer (such as a second stepped metal interconnect structure 28 or a bonding pad 38). In one embodiment, a bottom periphery of the second metal interconnect structure (such as the second stepped metal interconnect structure 28 or the bonding pad 38) is located entirely within, and is laterally spaced inward from, an outer periphery of the first metallic barrier liner 16 located within the second horizontal plane HP2. Thus, the second metal interconnect structure (such as the second stepped metal interconnect structure 28 or the bonding pad 38) does not contact the interconnect-level dielectric material layer (such as the first stepped-interconnect-level dielectric material layer 650). In one embodiment, the bottom periphery of the second metal interconnect structure (such as the second stepped metal interconnect structure 28 or the bonding pad 38) is laterally spaced from a top periphery of an interface between the first metallic barrier liner 16 and the first metallic fill material portion 17 located within the second horizontal plane HP2. Thus, the second metal interconnect structure (such as the second stepped metal interconnect structure 28 or the bonding pad 38) does not contact the first metallic fill material portion 17.

According to another aspect of the present disclosure, a device structure is provided, which comprises: an interconnect-level dielectric material layer (such as a first stepped-interconnect-level dielectric material layer 650) located over a substrate 8; and a first metal interconnect structure (such as a first stepped metal interconnect structure 18) embedded in the interconnect-level dielectric material layer and comprising a first metallic barrier liner 16 and a first metallic fill material portion 17 that is laterally surrounded by the first metallic barrier liner 16; an overlying dielectric material layer (such as a second stepped-interconnect-level dielectric material layer 660 or a pad-level dielectric material layer 670) that contacts a top surface of the interconnect-level dielectric material layer; and a second metal interconnect structure (such as a second stepped metal interconnect structure 28 or a bonding pad 38) embedded in the overlying dielectric material layer and contacting a top surface of the first metallic barrier liner 16, wherein an entirety of a top surface the first metallic fill material portion 17 contacts a bottom surface of the overlying dielectric material layer.

In one embodiment, the first metallic barrier liner 16 comprises a planar bottom barrier liner segment 16B underlying the first metallic fill material portion 17 and having a bottom surface located at, or below, a first horizontal plane HP1 including a bottom surface of interconnect-level dielectric material layer, sidewall segments 16S adjoined to a periphery of the planar bottom barrier liner segment 16B and vertically extending to a second horizontal plane HP2 including a top surface of the interconnect-level dielectric material layer, and a planar top barrier liner segment 16P adjoined to an outer sidewall of one of the sidewall segments 16S, having a top surface located within the second horizontal plane HP2, and laterally extending by a greater lateral distance than a lateral thickness of each of the sidewall segments 16S.

In one embodiment, a bottom periphery of the second metal interconnect structure (such as the second stepped metal interconnect structure 28 or the bonding pad 38) is located entirely within, and is laterally spaced inward from, an outer periphery of the first metallic barrier liner 16 located within the second horizontal plane HP2.

In one embodiment, the first metallic barrier liner 16 comprises a conductive metallic compound material, at least one refractory metal, or a stack there of; and the first metallic fill material portion 17 has a different material composition than the first metallic barrier liner 16, and comprises a material selected from aluminum, an aluminum-containing alloy including aluminum at a weight percentage greater than 90%, copper, a copper-containing alloy including copper at a weight percentage greater than 50%, tungsten, molybdenum, ruthenium, cobalt, nickel, silver, gold, and intermetallic alloys thereof.

In one embodiment, the device structure comprises: an underlying dielectric material layer (such as a fourth line-and-via-level dielectric material layer 640) that contacts a bottom surface of the interconnect-level dielectric material layer; and a third metal interconnect structure (such as a fourth metal line structure 648) embedded in the underlying dielectric material layer and contacting a bottom surface of the planar bottom barrier liner segment 16B of the first stepped metal interconnect structure 18.

The various embodiments of the present disclosure may be used to reduce plasma-induced damage to underlying semiconductor devices (such as field effect transistors 701) and to avoid collateral oxidation of metal interconnect structures. Particularly, aluminum, an aluminum-containing alloy, or copper is prone to surface oxidation, and provides high electrical conductivity to induce flow of large electrical current into the underlying semiconductor devices. In contrast, materials for a metallic barrier liner (such as a conductive metallic compound material or at least one refractory metal) is resistant to oxidation. Further, conductive metallic compound materials provide a resistivity that is at least one order of magnitude higher than elemental metals. Thus, physically exposing only the metallic barrier liner and covering a metallic fill material portion of a metal interconnect structure during an anisotropic etch process may protect the underlying semiconductor devices and may suppress oxidation of the metal interconnect structure. Suppression of oxidation may provide lower contact resistance between the metal interconnect structure and an overlying metal interconnect structure that is formed directly on the top surface of the metal interconnect structure. Providing a planar top barrier liner segment 16P has the benefit of increasing the area in which only the material of the metallic barrier liner is present, and thus, provides a direct contact on a top surface of the planar top barrier liner segment 16P.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a device structure, comprising:
forming underlying interconnect-level dielectric material layers embedding underlying metal interconnect structures over a substrate;
forming an interconnect-level dielectric material layer over the underlying interconnect-level dielectric material layers;
forming a stepped cavity through the interconnect-level dielectric material layer, wherein the stepped cavity comprises a deep cavity vertically extending from a first horizontal plane including a bottom surface of the interconnect-level dielectric material layer to a second horizontal plane including a top surface of the interconnect-level dielectric material layer and a shallow cavity vertically extending from a third horizontal plane located between the first horizontal plane and the second horizontal plane to the second horizontal plane;
depositing a first metallic barrier liner layer in the stepped cavity, wherein the first metallic barrier liner layer fills an entire volume of the shallow cavity and a peripheral region of the deep cavity;
depositing a first metallic fill material in a remaining volume of the deep cavity; and
removing portions of the first metallic fill material and the first metallic barrier liner layer from above the second horizontal plane, wherein a first metal interconnect structure including a first metallic barrier liner and a first metallic fill material portion is formed in the stepped cavity, the first metallic barrier liner including a first remaining portion of the first metallic barrier liner layer and the first metallic fill material portion including a second remaining portion of the first metallic fill material.

2. The method of claim 1, wherein:
removal of the portions of the first metallic fill material and the first metallic barrier liner layer from above the second horizontal plane is performed using a chemical mechanical polishing process; and
the first metallic barrier liner comprises a planar bottom barrier liner segment underlying the first metallic fill material portion and having a bottom surface located at, or below, the first horizontal plane, sidewall segments adjoined to a periphery of the planar bottom barrier liner segment and vertically extending to the second horizontal plane, and a planar top barrier liner segment adjoined to an outer sidewall of one of the sidewall segments, having a top surface located within the second horizontal plane, and laterally extending by a greater lateral distance than a lateral thickness of each of the sidewall segments.

3. The method of claim 2, wherein:
the first metallic barrier liner layer comprises a conductive metallic compound material, at least one refractory metal, or a stack there of; and
the first metallic fill material has a different material composition than the first metallic barrier liner layer, and comprises a material selected from aluminum, an aluminum-containing alloy including aluminum at a weight percentage greater than 90%, copper, a copper-containing alloy including copper at a weight percentage greater than 50%, tungsten, molybdenum, ruthenium, cobalt, nickel, silver, gold, and intermetallic alloys thereof.

4. The method of claim 2, further comprising:
forming an overlying dielectric material layer on the top surface of the interconnect-level dielectric material layer;
forming an additional cavity through the overlying dielectric material layer; and
forming a second metal interconnect structure in the additional cavity in the overlying dielectric material layer on a top surface of the first metal interconnect structure.

5. The method of claim 4, wherein the second metal interconnect structure contacts a top surface of the planar top barrier liner segment of the first metal interconnect structure, and does not contact the first metallic fill material portion; and
an entirety of a top surface of the first metallic fill material portion is in contact with a bottom surface of the overlying dielectric material layer.

6. The method of claim 1, wherein forming the first metal interconnect structure further comprises forming the first metallic fill material portion to comprise an indented rectangular shape comprising an indented portion and a remainder portion, wherein the indented portion comprises a width that is less than a width of the remainder portion, and wherein the indented portion is located adjacent to an indentation area that is adjoined to a side of the indented rectangular shape.

7. A method of forming a device structure, comprising:
forming a stepped cavity in an interconnect-level dielectric material layer such that the stepped cavity comprises a deep cavity portion and a shallow cavity portion such that the shallow cavity portion is adjacent to the deep cavity portion in a lateral direction;
depositing a first metallic barrier liner layer in the stepped cavity such that the first metallic barrier liner layer fills a first volume of the shallow cavity portion and covers sidewalls of the deep cavity portion; and
depositing a first metallic fill material in a second volume of the deep cavity portion,
wherein the first metallic barrier liner layer comprises a planar top barrier liner segment formed in the shallow cavity portion and adjoined to an outer sidewall of the deep cavity portion such that the planar top barrier liner segment extends laterally relative to the first metallic fill material.

8. The method of claim 7, wherein forming the stepped cavity in the interconnect-level dielectric material layer further comprises:
forming the deep cavity portion to extend from a first horizontal plane including a bottom surface of the interconnect-level dielectric material layer to a second horizontal plane including a top surface of the interconnect-level dielectric material layer; and
forming the shallow cavity portion to extend from a third horizontal plane, located between the first horizontal plane and the second horizontal plane, to the second horizontal plane.

9. The method of claim 8, further comprising:
removing portions of the first metallic fill material and the first metallic barrier liner layer from above the second horizontal plane, wherein a first metal interconnect structure including a first metallic barrier liner and a first metallic fill material portion is formed in the stepped cavity, the first metallic barrier liner including a first remaining portion of the first metallic barrier liner layer and the first metallic fill material portion including a second remaining portion of the first metallic fill material.

10. The method of claim 9, wherein depositing the first metallic barrier liner layer in the stepped cavity further comprises:
forming the first metallic barrier liner to comprise a bottom surface located at, or below, the first horizontal plane and sidewall segments adjoined to a periphery of a planar bottom barrier liner segment and vertically extending to the second horizontal plane; and
forming the planar top barrier liner segment to be adjoined to the outer sidewall of the deep cavity portion such that the outer sidewall is one of the sidewall segments.

11. The method of claim 10, further comprising:
forming the planar top barrier liner segment to have a top surface located within the second horizontal plane, and laterally extending by a greater lateral distance than a lateral thickness of each of the sidewall segments.

12. The method of claim 9, further comprising:
forming an overlying dielectric material layer on a top surface of the interconnect-level dielectric material layer and over the planar top barrier liner segment and the first metallic fill material such that an entirety of a top surface of the first metallic fill material portion is in contact with a bottom surface of the overlying dielectric material layer.

13. The method of claim 12, further comprising:
forming an additional cavity through the overlying dielectric material layer; and
forming a second metal interconnect structure in the additional cavity in the overlying dielectric material layer on a top surface of the first metal interconnect structure.

14. The method of claim 12, further comprising:
forming a second metal interconnect structure such that the second metal interconnect structure contacts a top surface of the planar top barrier liner segment of the first metal interconnect structure, and does not contact the first metallic fill material portion.

15. A method of forming a device structure, comprising:
forming an interconnect-level dielectric material layer over a substrate; and
forming a first stepped metal interconnect structure embedded in the interconnect-level dielectric material layer and comprising a first metallic barrier liner and a first metallic fill material portion,
wherein forming the first stepped metal interconnect structure further comprises forming the first metallic fill material portion to comprise an indented rectangular shape comprising an indented portion and a remainder portion, wherein the indented portion comprises a width that is less than a width of the remainder portion, and wherein the indented portion is located adjacent to an indentation area that is adjoined to a side of the indented rectangular shape.

16. The method of claim 15, further comprising:
forming an overlying dielectric material layer that contacts a top surface of the interconnect-level dielectric material layer; and
forming a second metal interconnect structure embedded in the overlying dielectric material layer and contacting a top surface of the first stepped metal interconnect structure,
wherein forming the second metal interconnect structure further comprises contacting the second metal interconnect structure with a top surface of a planar top barrier liner segment of the first stepped metal interconnect structure and so that the second metal interconnect structure does not contact the first metallic fill material portion.

17. The method of claim 16, wherein forming the overlying dielectric material layer further comprises forming the overlying dielectric material layer such that a top surface of the first metallic fill material portion is in contact with a bottom surface of the overlying dielectric material layer.

18. The method of claim 16, wherein forming the second metal interconnect structure further comprises forming the second metal interconnect structure such that an entirety of a bottom surface of the second metal interconnect structure is located within the indentation area.

19. The method of claim 16, wherein forming the second metal interconnect structure further comprises:
forming a first portion of a bottom surface of the second metal interconnect structure to be located within the indentation area; and
forming a second portion of the bottom surface of the second metal interconnect structure to be located outside a first area of the indented rectangular shape and within a second area that is adjacent to the indentation area.

20. The method of claim 15, wherein forming the first stepped metal interconnect structure further comprises:
forming the first metallic barrier liner to comprise a conductive metallic compound material, at least one refractory metal, or a stack there of; and
forming the first metallic fill material portion to have a different material composition than the first metallic barrier liner, and to comprise a material selected from aluminum, an aluminum-containing alloy including aluminum at a weight percentage greater than 90%, copper, a copper-containing alloy including copper at a weight percentage greater than 50%, tungsten, molybdenum, ruthenium, cobalt, nickel, silver, gold, and intermetallic alloys thereof.

* * * * *